(12) United States Patent
Chang et al.

(10) Patent No.: US 10,388,243 B2
(45) Date of Patent: Aug. 20, 2019

(54) DRIVING SYSTEM AND METHOD FOR DRIVING DISPLAY PANEL AND DISPLAY DEVICE THEREOF

(71) Applicant: NOVATEK Microelectronics Corp., Hsin-Chu (TW)

(72) Inventors: Shu-Wei Chang, New Taipei (TW); Chia-Chi Yu, Hsinchu County (TW); Kuo-Jen Hsu, Hsinchu County (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 0 days.

(21) Appl. No.: 15/480,358

(22) Filed: Apr. 5, 2017

(65) Prior Publication Data

US 2017/0213519 A1 Jul. 27, 2017

Related U.S. Application Data

(63) Continuation-in-part of application No. 14/331,235, filed on Jul. 15, 2014, now abandoned.

(30) Foreign Application Priority Data

May 6, 2014 (TW) .............................. 103116120 A

(51) Int. Cl.
*G09G 3/36* (2006.01)
*G11C 19/00* (2006.01)

(52) U.S. Cl.
CPC ......... *G09G 3/3688* (2013.01); *G09G 3/3648* (2013.01); *G09G 2300/0413* (2013.01);
(Continued)

(58) Field of Classification Search
CPC ............... G09G 3/3688; G09G 3/3648; G09G 2300/0413; G09G 2310/027;
(Continued)

(56) References Cited

U.S. PATENT DOCUMENTS 5,363,424 A 11/1994 Fujisawa
5,440,304 A 8/1995 Hirai
(Continued)

FOREIGN PATENT DOCUMENTS

CN 1627142 A 6/2005
CN 1758303 A 4/2006
(Continued)

*Primary Examiner* — Md Saiful A Siddiqui
(74) *Attorney, Agent, or Firm* — Winston Hsu

(57) ABSTRACT

The driving system for driving a display panel includes a timing controller and a source driving circuit. The source driving circuit includes a plurality of output channels and a plurality of shift registers respectively corresponding to the output channels. The plurality of shift registers are classified into a plurality of shift register series, among which a first shift register series includes a first shift register being as one end and a second shift register being as the other end, and a second shift register series includes a third shift register being as one end and a fourth shift register being as the other end. The timing controller is connected to the first shift register, the second shift register, the third shift register, and the fourth shift register, and transmits a first start pulse to the first shift register and a second start pulse to the third shift register.

27 Claims, 18 Drawing Sheets

(52) U.S. Cl.
CPC .................. *G09G 2310/027* (2013.01); *G09G 2310/0286* (2013.01); *G09G 2310/08* (2013.01); *G09G 2340/0407* (2013.01); *G09G 2370/08* (2013.01); *G11C 19/00* (2013.01)

(58) Field of Classification Search
CPC ... G09G 2340/0407; G09G 2310/0286; G09G 2310/08
See application file for complete search history.

(56) References Cited

U.S. PATENT DOCUMENTS

| | | | |
|---|---|---|---|
| 9,196,182 B2 | 11/2015 | Baek | |
| 2001/0003447 A1* | 6/2001 | Murai | G09G 3/3666 345/99 |
| 2002/0163493 A1 | 11/2002 | Matsushima | |
| 2005/0128169 A1* | 6/2005 | Kang | G09G 3/20 345/87 |
| 2006/0022603 A1* | 2/2006 | Shiraishi | G09G 3/3648 315/169.2 |
| 2006/0055656 A1 | 3/2006 | Chung | |
| 2006/0114217 A1 | 6/2006 | Kim | |
| 2007/0030237 A1 | 2/2007 | Chen | |
| 2008/0030453 A1* | 2/2008 | Chen | G09G 3/2092 345/98 |
| 2008/0079707 A1 | 4/2008 | Matsumoto | |
| 2008/0225036 A1* | 9/2008 | Song | G09G 3/3611 345/213 |
| 2009/0096775 A1 | 4/2009 | Lin | |
| 2009/0146940 A1* | 6/2009 | Kang | G09G 3/20 345/100 |
| 2012/0154356 A1 | 6/2012 | Hsu | |
| 2017/0011705 A1 | 1/2017 | Lin | |

FOREIGN PATENT DOCUMENTS

| | | |
|---|---|---|
| CN | 101441845 A | 5/2009 |
| CN | 101266762 B | 7/2012 |
| CN | 102968972 A | 3/2013 |
| TW | I249699 | 2/2006 |
| TW | I253623 | 4/2006 |
| TW | 200707395 | 2/2007 |
| TW | 200813914 | 3/2008 |
| TW | 200823863 | 6/2008 |

* cited by examiner

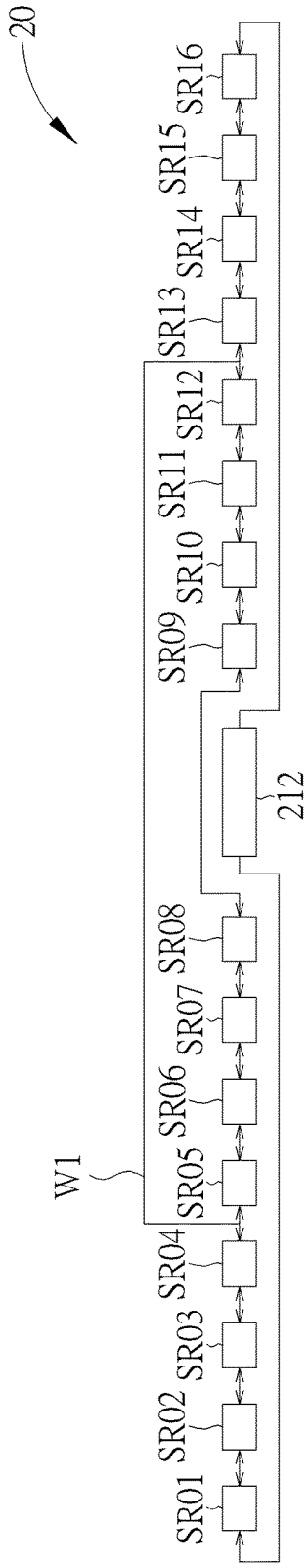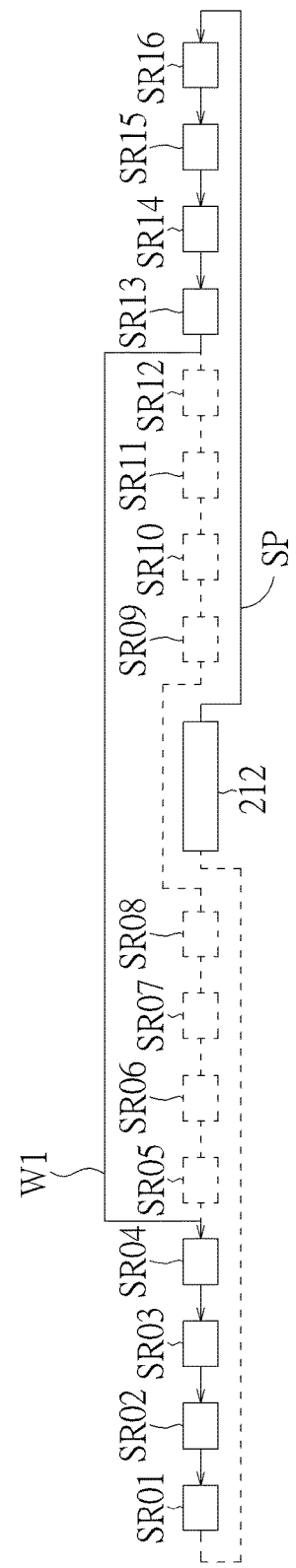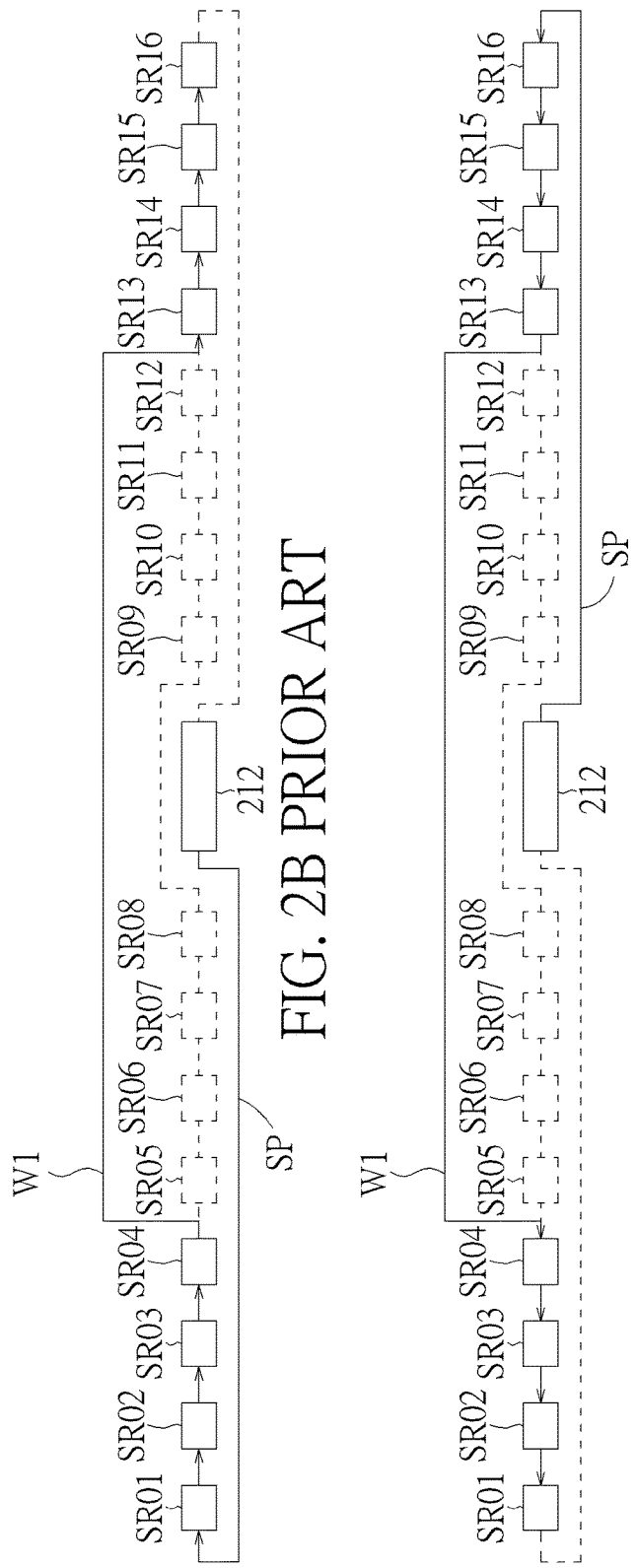
FIG. 2A PRIOR ART
FIG. 2B PRIOR ART
FIG. 2C PRIOR ART

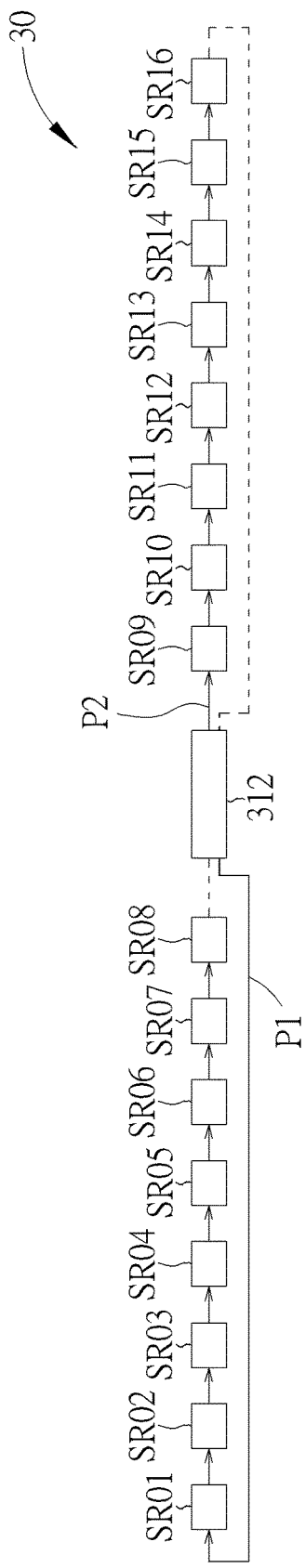
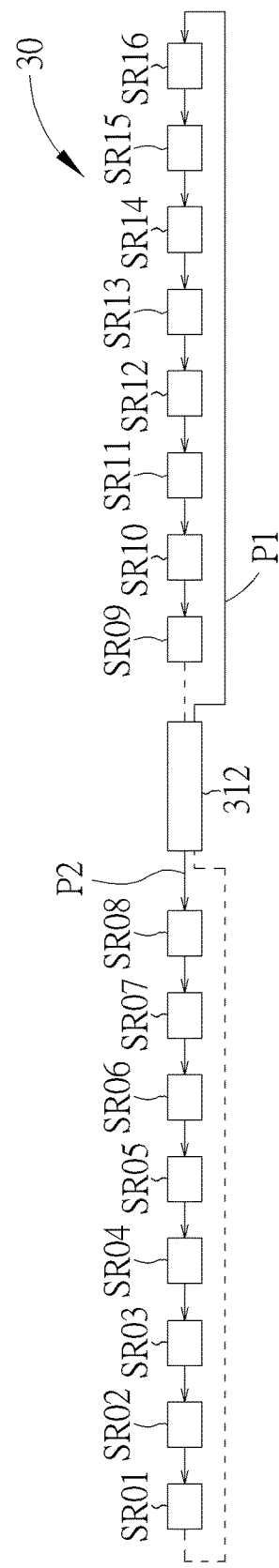
FIG. 4A
FIG. 4B

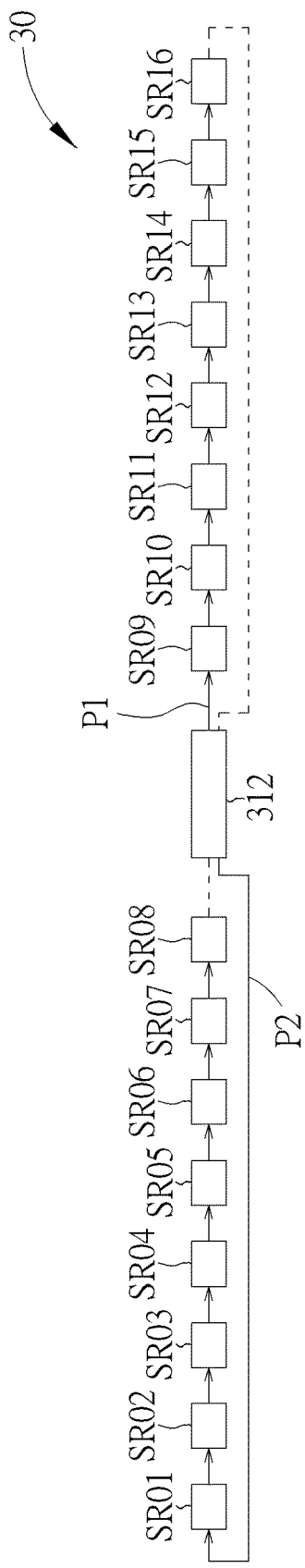
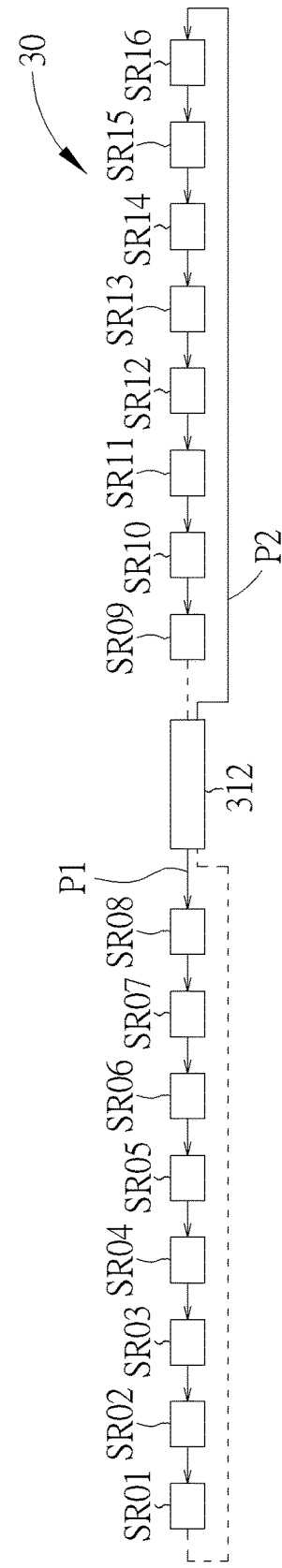
FIG. 5A
FIG. 5B

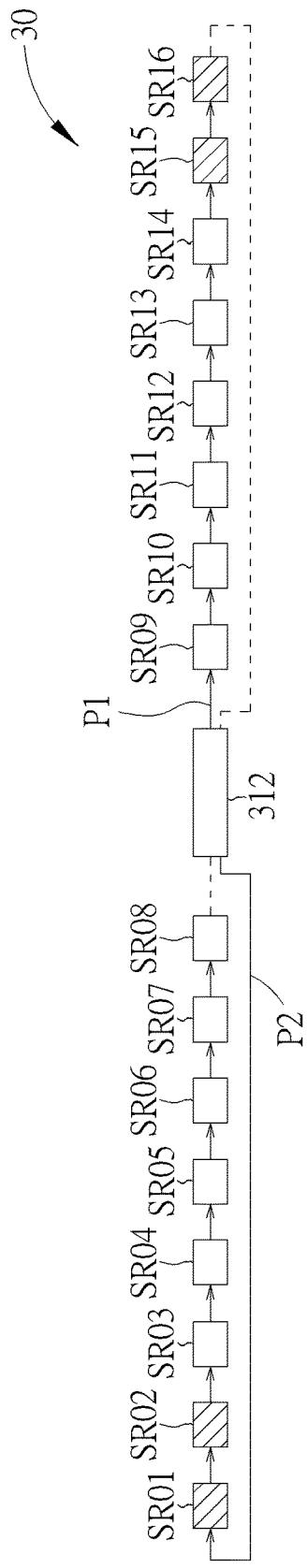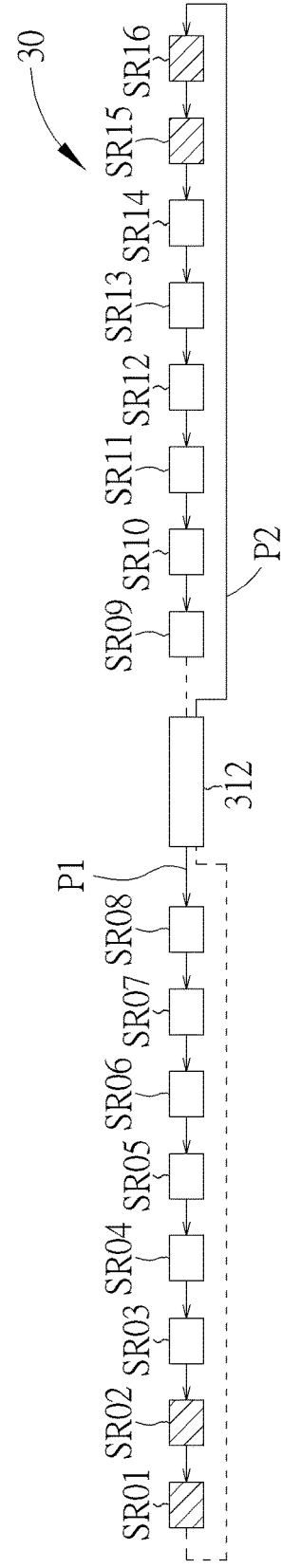
FIG. 5C
FIG. 5D

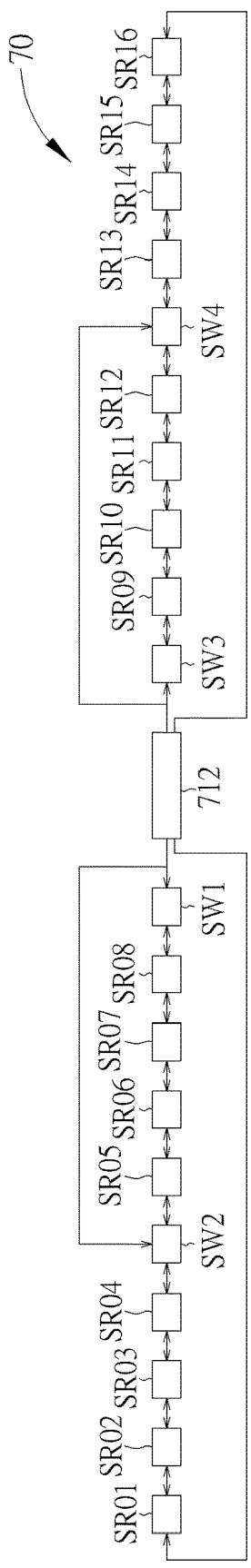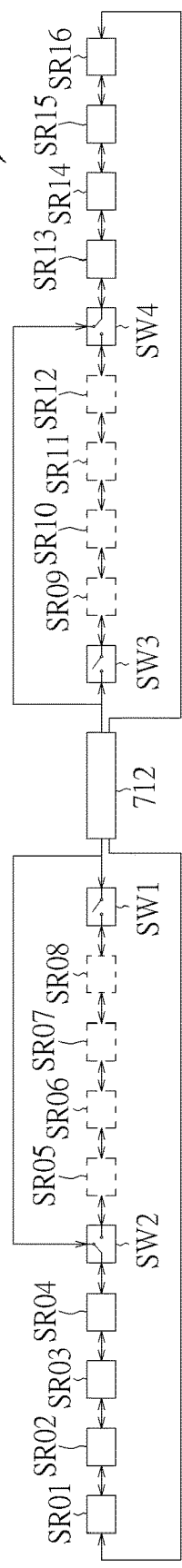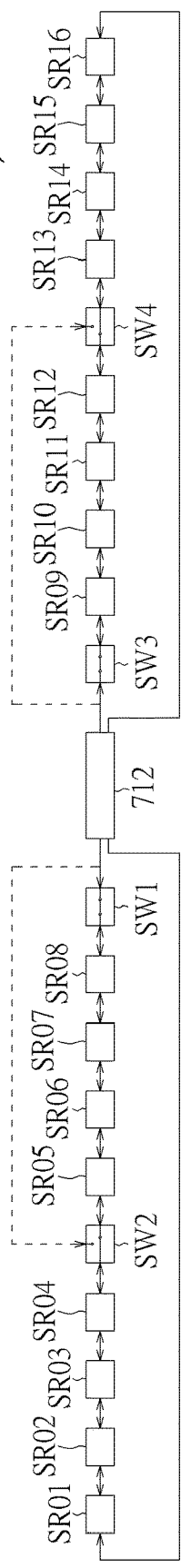
FIG. 7A
FIG. 7B
FIG. 7C

DRIVING SYSTEM AND METHOD FOR DRIVING DISPLAY PANEL AND DISPLAY DEVICE THEREOF

CROSS REFERENCE TO RELATED APPLICATIONS

This application is a continuation-in-part application of U.S. application Ser. No. 14/331,235, filed on Jul. 15, 2014, the contents of which are incorporated herein by reference.

BACKGROUND OF THE INVENTION

1. Field of the Invention

The present invention relates to a driving system and method used for a display panel, and more particularly, to a driving system and method for driving a display panel and a display device thereof.

2. Description of the Prior Art

Conventionally, a display device such as a liquid crystal display (LCD) device includes a display panel driven by a gate driving circuit and a source driving circuit. A timing controller is coupled to the gate driving circuit and the source driving circuit, and generates gate control signals (a.k.a. scan signals) to control the timing that data voltage signals from the source driving circuit output to the display panel. The timing controller, the source driving circuit and the gate driving circuit may be implemented in a single or separate semiconductor chips.

Generally, a source driving circuit is implemented to be capable of driving different display panels of different resolutions for a variety of devices, such as tablets, mobile phones and car navigation device, and the horizontal resolution of the display panel may be less than the maximum resolution that the source driving circuit can support. For example, the source driving circuit has 1280 data voltage output channels (abbreviated to output channels, which are referred to as output pins of a semiconductor chip where the source driving circuit is integrated), while the horizontal resolution of the display panel may be 960 pixels. In a case that each output channel may selectively output (via a multiplexer) data voltage signals to three data lines of the display panel, 320 extra output channels of the source driving circuit, i.e., 1280−960=320, are not coupled to data lines of the display panel, which means that the 320 output channels are configured to be dummy channels.

Since a source diving circuit should be adaptive to display panels of different horizontal resolutions, various methods are developed to adjust the number of dummy channels. A conventional method is to dispose additional connecting wires between different shift registers of a source driving circuit, allowing a start pulse to skip over several shift registers, and in such a way those output channels corresponding to the skipped shift registers are configured as the dummy channels.

Please refer to FIG. 1, which is a schematic diagram of a display device 10 according to the prior art. The display device 10 includes a display panel 100 and a driving system 110 for driving the display panel 100. The display panel 100 includes a plurality of pixel units. The driving system 110 includes a timing controller 112 and a source driving circuit. The source driving circuit includes a shift register circuit including a plurality of shift registers, a latch circuit, a level shifter circuit, a digital-to-analog converter (DAC) circuit, an output buffer circuit for generating data voltage signals, and a plurality of output channels coupled to the output buffer circuit through which the data voltage signals are outputted to data lines (not shown) of the display panel 100 to drive the pixel units. The output channels may be referred to as output pins of the semiconductor chip of the driving system 110. The (valid) output channels are one-to-one or one-to-many coupled to data lines of the display panel 100. The timing controller 112 may transmit a start pulse to the shift register circuit and the start pulse is sequentially shifted though the shift registers based on a clock signal (not shown in FIG. 1). A shift register is able to enable a corresponding latch unit to sample pixel data corresponding to an output channel. In FIG. 1, a connecting wire W1 is disposed to connect between two nonadjacent shift registers, which allows the start pulse to skip over several shift registers such that output channels corresponding to the skipped shift registers are configured as dummy channels. The dummy channels are not coupled to data lines of the display panel 100.

FIG. 2A is a schematic diagram of a driving system 20, which gives a clear example regarding to the connecting wire W1 of FIG. 1. In FIG. 2A, only a partial circuit of the driving system 20, including a timing controller 212 and shift registers SR01-SR16 connected in series, is illustrated. The connecting wire W1 is connected between two nonadjacent shift registers, SR04 and SR13, allowing a start pulse SP to skip over shift registers SR05-SR12 such that output channels corresponding to the shift registers SR05-SR12 are configured as the dummy channels.

FIG. 2B and FIG. 2C illustrate the same circuit as in FIG. 2A, with different transmission directions of a start pulse SP when dummy channels are configured. In FIG. 2B, the timing controller 212 transmits the start pulse SP to the shift register SR01, and the start pulse SP is shifted sequentially. After the start pulse SP is shifted to the shift register SR04, the start pulse SP is then shifted to the shift register SR13 through the connecting wire W1 (as a bypass). In FIG. 2C, the timing controller 212 transmits the start pulse SP to the shift register SR16, and the start pulse SP is shifted sequentially. After the start pulse SP is shifted to the shift register SR13, the start pulse SP is then shifted to the shift register SR04 through the connecting wire W1. By using the connecting wire W1, the source driving circuit having 16 output channels may be able to drive a display panel with horizontal resolution of 8 pixels.

In order to support different horizontal resolutions of different display panels, a source driving circuit of a conventional driving system includes a plenty of connecting wires like the connecting wire W1 shown in FIG. 1 and FIGS. 2A-2C to skip different number of shift registers so as to configure different number of dummy channels. For example, a source driving circuit having 1280 output channels can also support horizontal resolutions of 720 pixels and 960 pixels by using two additional connecting wires. That is, one additional connecting wire skips over 320 shift registers so that 320 (i.e., 1280−960) dummy channels are configured, and the other additional connecting wire skips over 560 shift registers so that 560 (i.e., 1280−720) dummy channels are configured. These additional wire connections consume circuit layout area and reduce layout flexibility. Thus, there is a need to provide a more efficient method and a source driving circuit which is adaptive to more horizontal resolutions, and thus adaptive to more types of display panels.

SUMMARY OF THE INVENTION

It is therefore an objective of the present invention to provide a driving system and method for driving a display panel and a display device thereof, in order to solve the abovementioned problem.

The present invention discloses a driving system for driving a display panel. The driving system comprises a timing controller and a source driving circuit. The timing controller is configured to generate a first start pulse and a second start pulse. The source driving circuit comprises a plurality of output channels and a plurality of shift registers respectively corresponding to the plurality of output channels. The plurality of shift registers are classified into a plurality of shift register series, a first shift register series among the plurality of shift register series comprises a first shift register being as one end of the first shift register series and a second shift register being as the other end of the first shift register series, and a second shift register series among the plurality of shift register series comprises a third shift register being as one end of the second shift register series and a fourth shift register being as the other end of the second shift register series. The timing controller is connected to the first shift register, the second shift register, the third shift register, and the fourth shift register, and the timing controller is configured to transmit the first start pulse to the first shift register and to transmit the second start pulse to the third shift register.

The present invention further discloses a display device, which comprises a display panel, a timing controller and a source driving circuit for driving the display panel. The timing controller is configured to generate a first start pulse and a second start pulse. The source driving circuit is utilized for driving the display panel, and comprises a plurality of output channels and a plurality of shift registers respectively corresponding to the plurality of output channels. The plurality of shift registers are classified into a plurality of shift register series, a first shift register series among the plurality of shift register series comprises a first shift register being as one end of the first shift register series and a second shift register being as the other end of the first shift register series, and a second shift register series among the plurality of shift register series comprises a third shift register being as one end of the second shift register series and a fourth shift register being as the other end of the second shift register series. The timing controller is connected to the first shift register, the second shift register, the third shift register, and the fourth shift register, and the timing controller is configured to transmit the first start pulse to the first shift register and to transmit the second start pulse to the third shift register.

The present invention further discloses a method of driving a display panel for a driving system comprising a timing controller and a source driving circuit. The method comprises transmitting, by the timing controller, a first start pulse to one end of a first shift register series of a source driving circuit; and transmitting, by the timing controller, a second start pulse to one end of a second shift register series of the source driving circuit, before the first start pulse is shifted to a target shift register of the first shift register series.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2A-2C are schematic diagrams of an exemplary driving system having 16 shift registers, which correspond to 16 output channels of a source driving circuit.

FIGS. 4A and 4B are schematic diagrams of the driving system of FIG. 3.

FIGS. 5A and 5B are schematic diagrams of the driving system of FIG. 3.

FIGS. 5C and 5D are schematic diagrams of the driving system of FIG. 3 with configuration of dummy channels.

FIGS. 7A-7C are schematic diagrams of a driving system according to an embodiment of the present invention.

DETAILED DESCRIPTION

Figure 1:
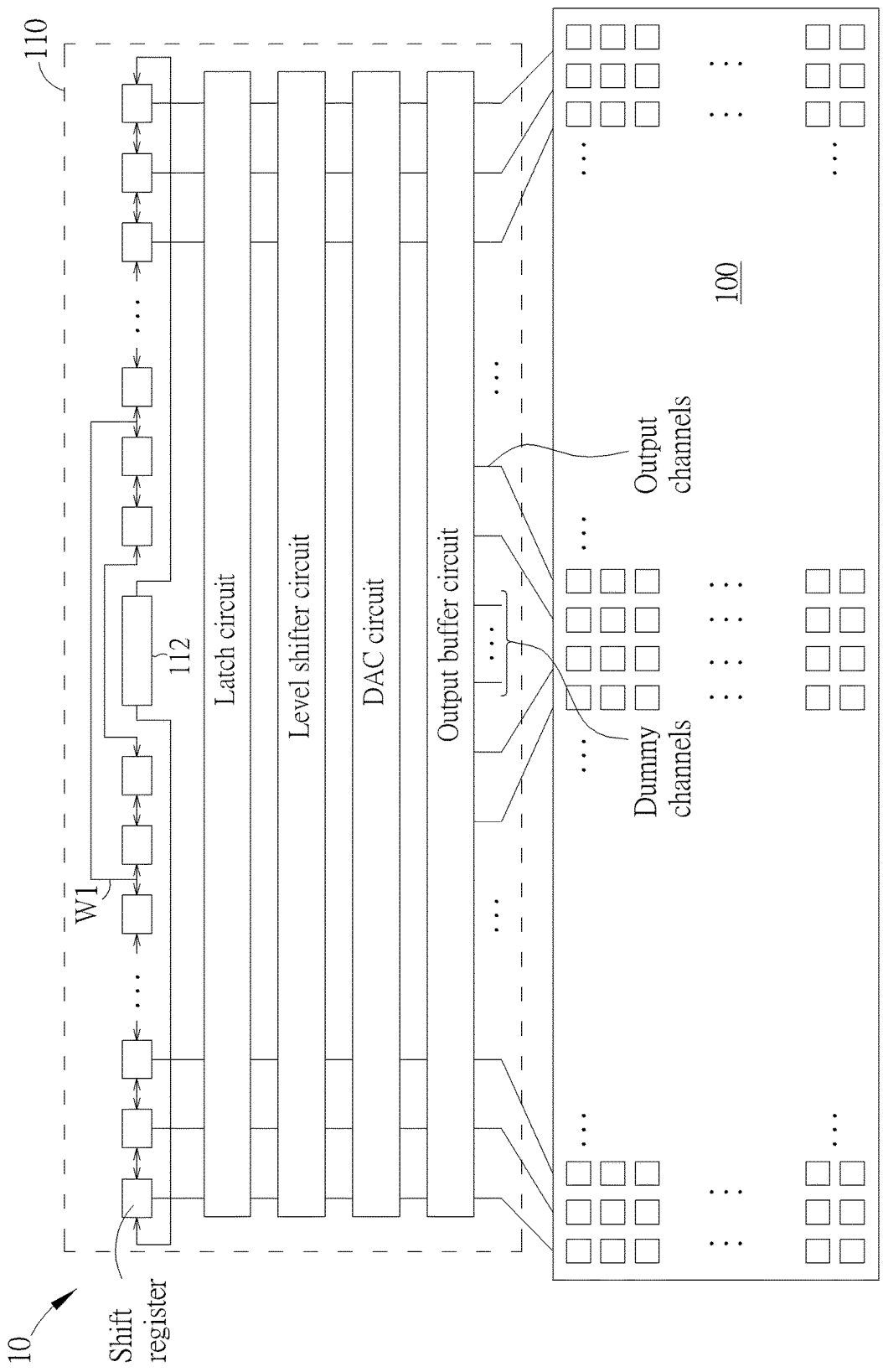
FIG. 1 is a schematic diagram of a display device according to the prior art.
Figure 3:
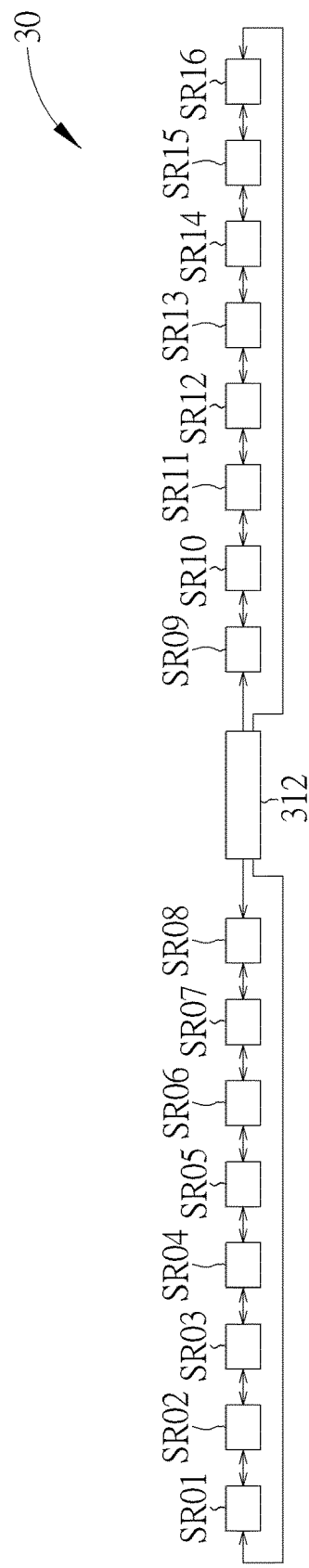
FIG. 3 is a schematic diagram of a driving system according to an embodiment of the present invention.

Please refer to FIG. 3, which is a schematic diagram of a driving system 30 according to an embodiment of the present invention. FIG. 3 illustrates a partial circuit of the driving system 30, including a timing controller 312 and a shift register circuit of a source driving circuit. The source driving circuit of the driving system also includes a latch circuit, a level shifter circuit, a DAC circuit, an output buffer circuit, and a plurality of output channels those are omitted in FIG. 3 and may be referred to FIG. 1. It is noted that output channels are referred to as output pins of a semiconductor chip where the source driving circuit or the driving system 30 is integrated, and the output channels recited in the detailed description are data voltage output channels. For simplicity, FIG. 3 illustrate that the shift register circuit is configured to include 16 shift registers SR01-SR16 corresponding to 16 output channels as an example. Those skilled in the art should realize that a source driving circuit may include hundreds or thousands of shift registers and corresponding output channels in general.

The shift registers SR01-SR16 are classified into two shift register series, referred to as a first shift register series and a second shift register, where each shift register series refers to multiple shift registers connected in series. The first shift register series may be disposed at one side of the timing controller 312, and the second shift series may be disposed at the other side of the timing controller 312. The timing controller 312 may be configured to transmit two start pulses, referred to as a first start pulse P1 and a second start pulse P2 (which are shown in FIG. 4A and FIG. 4B), to respective shift register series at different time, or at the same time. In one of embodiments of the present invention, the second start pulse P2 is later than the first start pulse P1. The connecting wires shown in FIG. 3 between the timing controller 312 and the shift registers (SR01, SR08, SR09 and SR16) are used for the timing controller 312 to transmit the first start pulse P1 and the second start pulse P2. In the source driving circuit, the timing controller 312 also transmits a clock signal (not shown) to each of the shift registers SR01-SR16. The first start pulse P1 or the second start pulse P2 is shifted from a shift register to its adjacent (next) shift register in one period, e.g., one clock cycle, according to the clock signal.

Please refer to FIGS. 4A and 4B, which illustrate the same circuit as in FIG. 3, with indicating different transmission directions of the first start pulse P1 and the second start pulse P2. In an exemplary case that 1-to-3 multiplexers are used in the display panel for coupling an output channel to one of corresponding data lines, the total 16 output channels of the source driving circuit of the driving system 30 may be fully used for driving the display panel having a horizontal resolution of 16 pixels.

FIG. 4A illustrates a left-to-right transmission direction of the start pulses. In FIG. 4A, the shift registers SR01-SR08 is taken as the first shift register series and the shift registers SR09-SR16 is taken as the second shift register series. In the first shift register series, the shift register SR01 is at one end of the first shift register series and the shift register SR08 is at the other end of the first shift register series. The timing controller 312 is connected to the shift register SR01 and also connected to the shift register SR08. In the second shift register series, the shift register SR09 is at one end of the second shift register series and the shift register SR16 is at the other end of the second shift register series. The timing controller 312 is connected to the shift register SR09 and also connected to the shift register SR16. As shown in FIG. 4A, the timing controller 312 may transmit the first start pulse P1 to the shift register SR01 of the first shift register series, and after the start pulse P1 is shifted to the shift register SR08 of the first shift register series, the timing controller 312 may transmit the second start pulse P2 to the shift register SR09 of the second shift register series such that the second pulse P2 is able to be shifted to the last shift register, SR16.

FIG. 4B illustrates a right-to-left transmission direction of the start pulses. In FIG. 4B, the shift registers SR16-SR09 is taken as a first shift register series and the shift registers SR08-SR01 is taken as a second shift register series. As shown in FIG. 4B, the timing controller 312 may transmit the first start pulse P1 to the shift register SR16, and after the start pulse P1 is shifted to the shift register SR09, the timing controller 312 may transmit the second start pulse P2 to the shift register SR08 such that the second pulse P2 is able to be shifted to the last shift register, SR01.

Different from the source driving circuit shown in FIGS. 2A-2C where 16 shift registers are connected in series (where the SR08 is connected to SR09) and only one start pulse is transmitted, the two shift register series of the source driving circuit shown in FIG. 3 are not directly connected to each other, and the timing controller 312 may be able to transmits two start pulses to respective shift register series. That is, in the example of FIG. 3 there is no physical wire connection for shifting a start pulse from an end of the first shift register series (e.g., SR08, or SR09) to an end of the second shift register series (e.g., SR09, or SR08).

When the driving system 30 is used for driving a display panel having a horizontal resolution of 16 pixels, the number of output channels (i.e., 16 output channels) of the source driving circuit in the driving system 30 is equivalent to the horizontal resolution of the display panel based on a case that 1-to-3 multiplexers are used for selectively coupling to data lines.

The driving system 30 including the circuit shown in FIG. 3 may further support different display panels with different resolutions. In a situation that the number of output channels (i.e., data voltage output channels) of the driving system 30 is more than the number of output channels required for driving a display panel, some output channels not coupled to data lines of the display panel are configured to dummy output channels, abbreviated to dummy channels. In an embodiment, a portion of the first shift register series and a portion of the second shift register series are corresponding to dummy channels. The number of dummy channels corresponding to (a portion of) shift registers in the first shift register series may be equivalent to or different from the number of dummy channels corresponding to (a portion of) shift registers in the second shift register series. Those skilled in the art should realize that the allocation of dummy channels is not a limitation of the present invention.

If there are dummy channels in the source driving circuit, based on the transmission direction of the start pulses shown in FIG. 4A as an example, the timing controller 312 may transmit the second start pulse P2 to the shift register SR09 before the first start pulse P1 is shifted to the shift register SR08, allowing the dummy channels to be skipped over. More specifically, the second start pulse P2 may be transmitted by the timing controller 312 to the shift register SR09 when the first start pulse P1 is shifted to a target shift register in the first shift register series, which may be any shift register SR01-SR08 of the first shift register series.

Figure 4C:
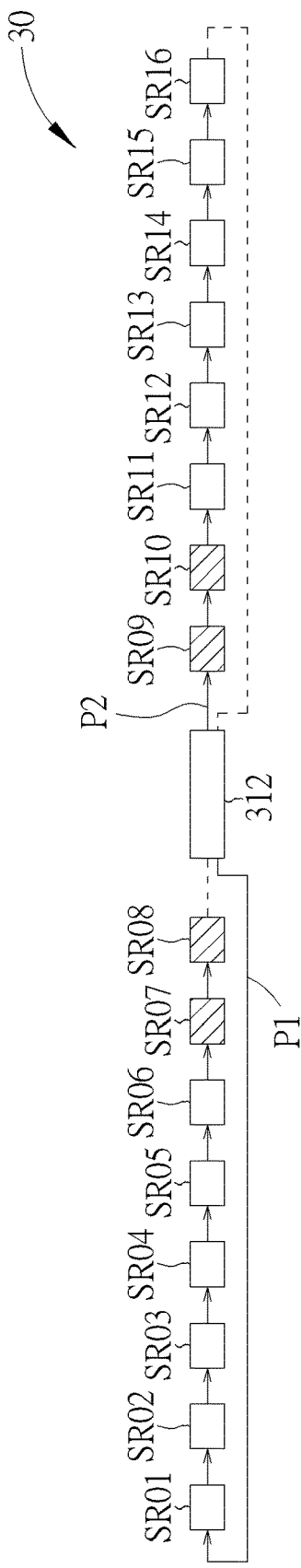
FIGS. 4C and 4D are schematic diagrams of the driving system of FIG. 3 with configuration of dummy channels.
Figure 4D:
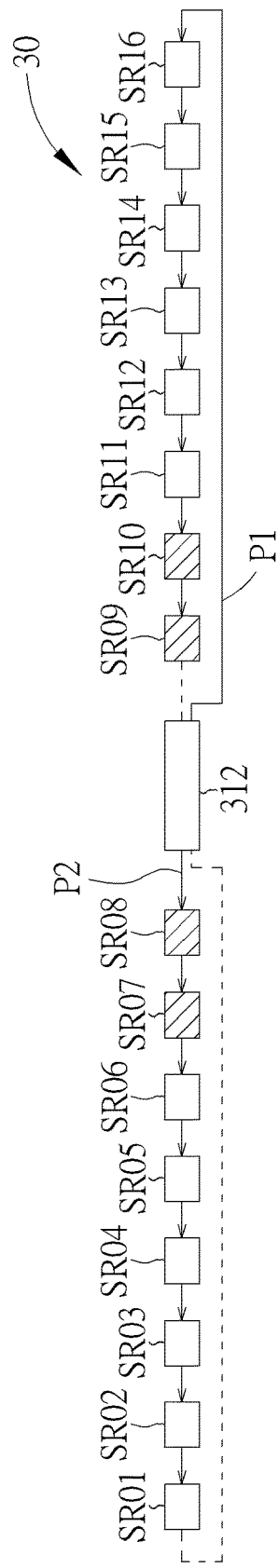

Please refer to FIGS. 4C and 4D, which illustrate the same shift register circuit as in FIG. 3 and indicate different transmission directions of the first start pulse P1 and the second start pulse P2. In the examples of FIGS. 4C and 4D, four output channels corresponding to the four shift registers SR07, SR08, SR09 and SR10 are configured to dummy channels so that remaining valid output channels are 12 output channels, which are enough to drive a display panel having a horizontal resolution of 12 pixels (if based on using 1-to-3 multiplexers). In FIGS. 4C and 4D, shift registers marked with slash pattern are corresponding to dummy channels.

FIG. 4C illustrates a left-to-right transmission direction of the start pulses. In FIG. 4C, the shift registers SR01-SR08 is taken as the first shift register series and the shift registers SR09-SR16 is taken as the second shift register series. Please also refer to FIG. 4E, which is a waveform diagram illustrating the waveforms of the start pulses P1 and P2 transmitted based on the direction shown in FIG. 4C. First, the timing controller 312 may transmit the first start pulse P1 to the first shift register of the first shift register series, SR01, and the shift register SR01 shifts the first start pulse P1 rightward. And, the timing controller 312 may transmit the second start pulse P2, to the first shift register of the second shift register series, SR09, before the first start pulse P1 is shifted to a target shift register of the first shift register series. In this example the target shift register is SR05. That is, the timing controller 312 may transmit the second start pulse P2 when the first start pulse P1 is in the shift register SR04, such that in the next period, the first start pulse P1 may arrive at the target shift register SR05 and the second start pulse P2 may arrive at the shift register SR09 substantially at the same time. After the second start pulse P2 is transmitted to the second shift register series, the second start pulse P2 is sequentially shifted rightward to the last shift register SR16.

The target shift register is determined according to the number of dummy channels, denoted by D, and the number of shift registers of the first shift register series, denoted by N. More specifically, the first shift register which firstly receives the first start pulse P1 from the timing controller 312 and the target shift register are separated by (N-D-1) shift registers. In the embodiment shown in FIG. 4C, N equals 8 and D equals 4, and thus the shift register SR01 and the target shift register SR05 are separated by (N-D-1)=3 shift registers (i.e., the shift registers SR02, SR03 and SR04). Therefore, the time point of transmitting the second start pulse P2 may be determined according to the number of dummy channels in the source driving circuit. If the number of dummy channels is larger, the timing controller may transmit the second start pulse P2 earlier.

FIG. 4D illustrates a right-to-left transmission direction of the start pulses. In FIG. 4D, the shift registers SR16-SR09 is taken as the first shift register series and the shift registers SR08-SR01 is taken as the second shift register series. Similar to the example of FIG. 4C, firstly the timing controller 312 may transmit the first start pulse P1 to the first shift register of the first shift register series, SR16, and the shift register SR16 shifts the first start pulse P1 left forward. And, the timing controller 312 may transmit the second start pulse P2, to the first shift register of the second shift register series, SR08, before the first start pulse P1 is shifted to a target shift register of the first shift register series. In this example the target shift register is SR12. That is, the timing controller 312 may transmit the second start pulse P2 when the first start pulse P1 is in the shift register SR13, such that in the next period, the first start pulse P1 may arrive at the target shift register SR12 and the second start pulse P2 may arrive at the shift register SR08 substantially at the same time.

In the source driving circuit of the driving system 30, there is a latch circuit coupled to the shift register circuit. Based on the example of FIG. 3, the latch circuit of the source driving circuit of the driving system 30 may include 16 latch units, denoted by L01-L16 (not shown in FIG. 3), respectively coupled to 16 shift registers SR01-SR16. In an embodiment, whatever the shift registers (SR01-SR06 and SR11-SR16) corresponding to valid output channels or the shift registers (SR07-SR10) corresponding to dummy channels may be able to shift a received start pulse (P1 or P2) and accordingly generate an enable signal to enable a corresponding latch unit to sample data transmitted on a data bus. Therefore, pixel data of a horizontal display line are sequentially sampled by the latch units. Each of the latch units L01-L08 is coupled to a data bus, denoted by BUS1, and each of the latch units L09-L16 is coupled to the other data bus, denoted by BUS2 (not shown in FIG. 3). The timing controller 312 is coupled to the data buses BUS1 and BUS2 and may respectively control timing of pixel data transmission through the data buses. The timing controller 312 may know, by using a counter for example, the shift register which the start pulse (P1 or P2) is currently shifted to, and therefore the timing controller 312 may be able to output corresponding data (which may be valid pixel data or dummy data) on a data bus such that the data can be sampled by the corresponding latch unit. Valid output channels corresponding to the shift registers SR01-SR06 and SR11-SR16 are denoted by CH01-CH06 and CH11-CH16, and dummy channels corresponding to the shift registers SR07-SR10 are denoted by CH07-CH10 (not shown in FIG. 3).

In an embodiment of the present invention, in response to that a start pulse (P1 or P2) is shifted to a shift register corresponding to a dummy channel, such as SR07, SR08, SR09 or SR10 in FIGS. 4C and 4D, there is no valid pixel data transmitted on the data bus and the voltage level of the data bus may be controlled to be at a specific voltage level, referred to as a dummy data, and in such a way the latch unit corresponding to SR07, SR08, SR09 or SR10 may sample the dummy data. The dummy data sampled by the latch unit is corresponding to a dummy channel not coupled to data lines of the display panel.

In another embodiment of the present invention, the timing controller 312 may know the timing when the first start pulse P1 is shifted to the shift register SR06 which is before the shift register SR07 corresponding to a dummy channel, and in such a case the timing controller 312 may stop transmitting the clock signal to the shift registers in next two periods. In such a way, the shift registers SR07 and SR08 are not able to shift the first start pulse P1 and not able to generate corresponding enable signals, and the corresponding latch units do not sample pixel data.

Figure 4E:
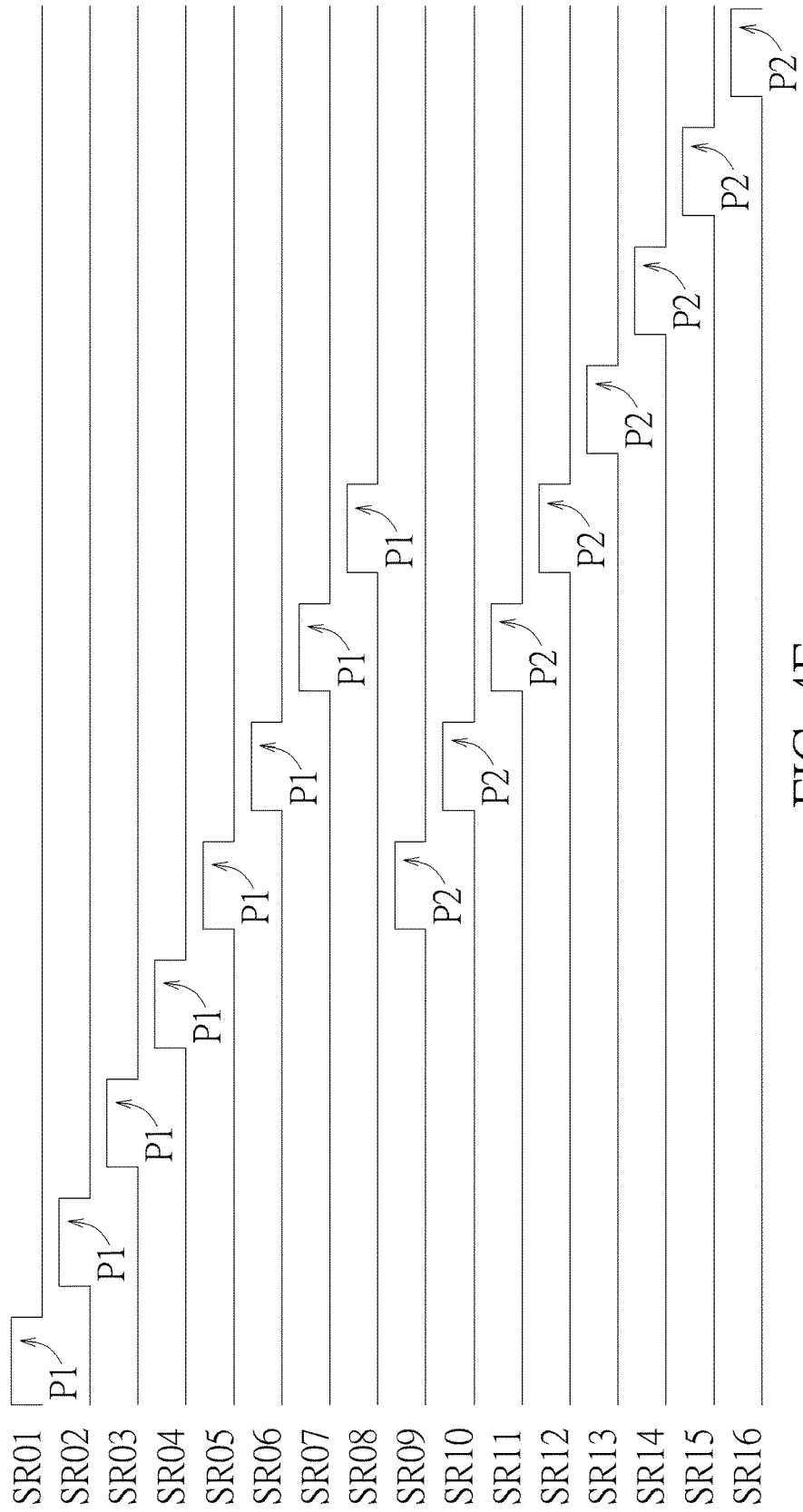
FIG. 4E is a waveform diagram illustrating the waveforms of the start pulses of FIG. 4A.

Taking FIG. 4C and FIG. 4E as an example, when the first start pulse P1 is sequentially shifted in the shift registers SR01-SR04, the timing controller 312 may regularly output pixel data on the data bus BUS1 such that the latch units L01-L04 may sequentially sample pixel data transmitted on the data bus BUS1. Therefore, the output channels CH01-CH04 are able to output data voltage signals.

When the first start pulse P1 is shifted and arrives at the target shift register SR05, the second start pulse P2 transmitted from the timing controller 312 arrives at the shift register SR09 at substantially the same time. Correspondingly, the timing controller 312 may transmit corresponding pixel data on the data bus BUS1 and transmit dummy data on the data bus BUS2 (which means to control BUS2 to be at a specific voltage level), in such a way the output channel CH05 may output a data voltage signal and the dummy channel CH09 may output a dummy signal.

In a next period, the first start pulse P1 is shifted to the shift register SR06 and the second start pulse P2 is shifted to the shift register SR10, and correspondingly, the timing controller 312 may transmit corresponding pixel data on the data bus BUS1 and transmit dummy data on the data bus BUS2 so that the output channel CH06 may output a data voltage signal and the dummy channel CH10 may output a dummy signal.

Further, in a next period, the first start pulse P1 is shifted to the shift register SR07 corresponding to the dummy channel CH07 and the second start pulse P2 is shifted to the shift register SR11 corresponding to the valid output channel CH11, and correspondingly, the timing controller 312 may transmit dummy data on the data bus BUS1 (which means to control BUS1 to be at a specific voltage level) and transmit corresponding pixel data on the data bus BUS2 so that the dummy channel CH07 may output a dummy signal and the output channel CH11 may output a data voltage signal.

Further, in a next period, the first start pulse P1 is shifted to the shift register SR08 corresponding to the dummy channel CH08 and the second start pulse P2 is shifted to the shift register SR12 corresponding to the valid output channel CH12. The dummy channel CH08 may output a dummy signal and the output channel CH12 may output a data voltage signal. The second start pulse P2 is then sequentially shifted to a final shift register SR16, and the output channels CH13-CH16 may output data voltage signals.

Based on the driving system 30 shown in FIG. 3, the first start pulse P1 and the second start pulse P2 may be transmitted to the shift register series indifferent ways from the illustrated in FIGS. 4A-4D. Please refer to FIGS. 5A to 5D, which illustrate the same circuit as in FIG. 3, with indicating different transmission directions of the first start pulse P1 and the second start pulse P2. FIGS. 5A and 5B illustrate that the 16 shift registers are corresponding to valid output channels.

According to FIG. 5A, the timing controller 312 may first transmit the first start pulse P1 to the first shift register of the first shift register series (SR09-SR16), SR09, and after the first start pulse P1 is sequentially shifted to the end of the first shift register series, SR16, the timing controller 312 may transmit the second start pulse P2 to the first shift register of the second shift register series (SR01-SR08), SR01, and the second start pulse P2 is sequentially shifted to the end of the second shift register series, SR08. According to FIG. 5B, the timing controller 312 may first transmit the first start pulse P1 to the first shift register of the first shift register series (SR08-SR01), SR08, and later may transmit the second start pulse P2 to the first shift register of the second shift register series (SR16-SR09), SR16.

Figure 5E:
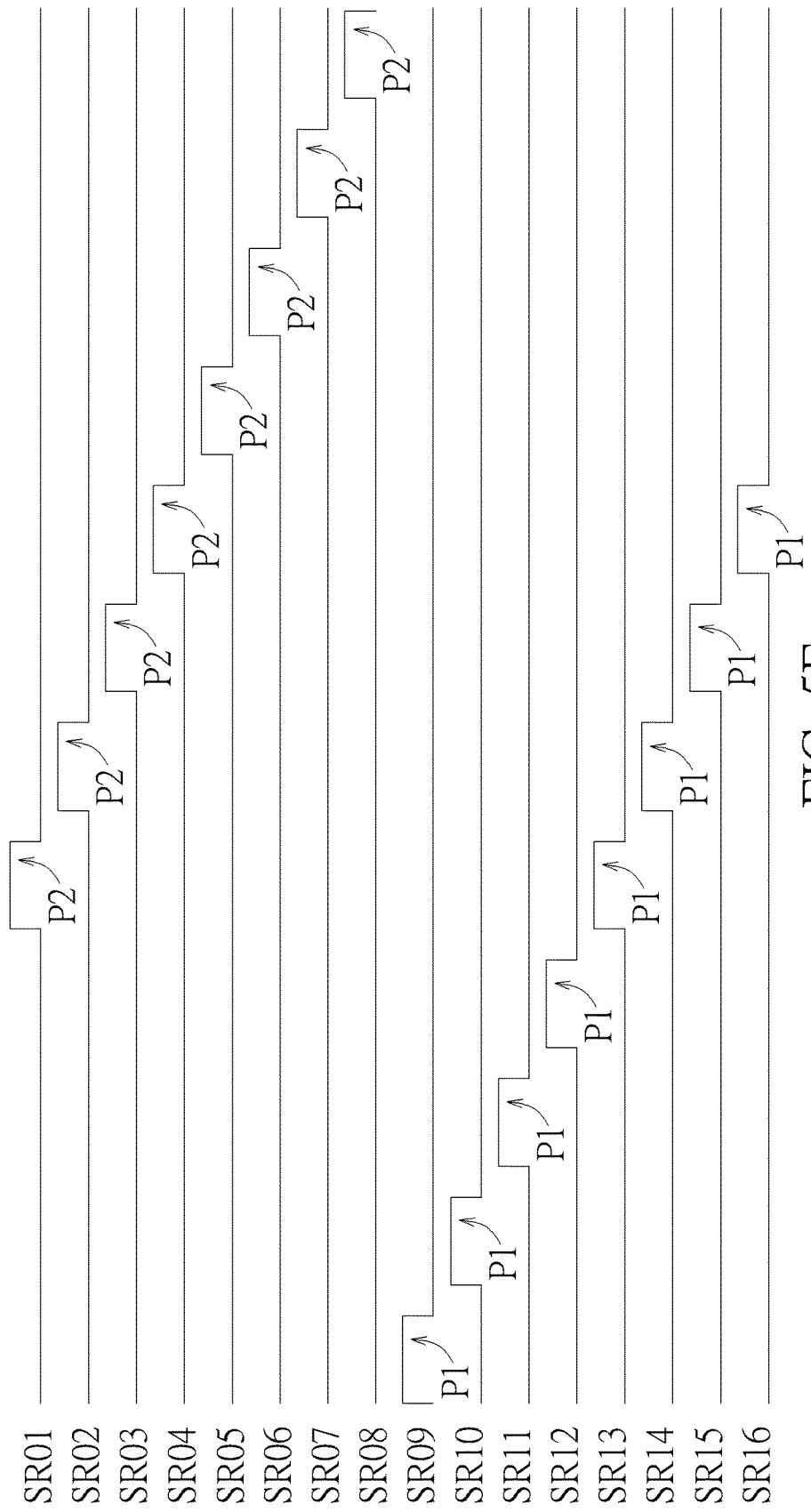
FIG. 5E is a waveform diagram illustrating the waveforms of the start pulses of FIG. 5C.

Please refer to FIGS. 5C and 5D, four output channels corresponding to the shift registers SR01, SR02, SR15 and SR16 (marked with slash pattern) are configured to dummy channels, and the shift registers SR03-SR14 are corresponding to 12 valid output channels, which are enough to drive a display panel having a horizontal resolution of 12 pixels (if based on using 1-to-3 multiplexers). According to FIG. 5C, the timing controller 312 may transmit the second start pulse P2 to the shift register SR01 before the first start pulse P1 is shifted to the target shift register SR13, such that in the next period, the first start pulse P1 may arrive at the target shift register SR13 and the second start pulse P2 may arrive at the shift register SR01 substantially at the same time. Please also refer to FIG. 5E, which is a waveform diagram illustrating the waveforms of the start pulses P1 and P2 transmitted based on the direction shown in FIG. 5C.

FIG. 5D illustrates a scheme similar to FIG. 5C and the related description is omitted. The timing controller 312 may transmit pixel data or dummy data on the data buses at proper timing so that the latch units corresponding to the shift registers SR03-SR14 may sample pixel data and the latch units corresponding to the shift registers SR01, SR02, SR15 and SR16 may sample dummy data.

Please refer to FIGS. 6A-6E, which are schematic diagrams of the method of transmitting start pulses to the shift register in a display device 60 according to an embodiment of the present invention. As shown in FIGS. 6A-6E, the display device 60 includes a display panel 600 and a source driving circuit 610. Note that the display device 60 may further include a timing controller, which are omitted herein without influencing the illustrations of the present embodiment. The source driving circuit 610 includes a shift register circuit including a plurality of shift registers, and a plurality of output channels corresponding to the shift registers, wherein several output channels are coupled to data lines of the display panel 600, called valid output channels hereinafter, and several output channels are configured as dummy channels without being coupled to data lines of the display panel 600. The dummy channels are located in the middle region of the output channels. The shift registers in the source driving circuit 610 are separated into a first shift register series and a second shift register series, where each shift register corresponds to an output channel. The timing controller may transmit a first start pulse (as P1 shown in FIG. 4C) to the first (leftmost, in this example) shift register of the first shift register series, and transmit a second start pulse (as P2 shown in FIG. 4C) to the first (leftmost, in this example) shift register of the second shift register series. The start pulses are shifted rightward. Shift registers which are marked by oblique line in FIGS. 6A-6E means the shift registers those has shifted the start pulse. It is noted that the latch circuit, the level shifter circuit, the DAC circuit and the output buffer circuit are omitted in the source driving circuit 610 of FIGS. 6A-6E.

Figure 6A:
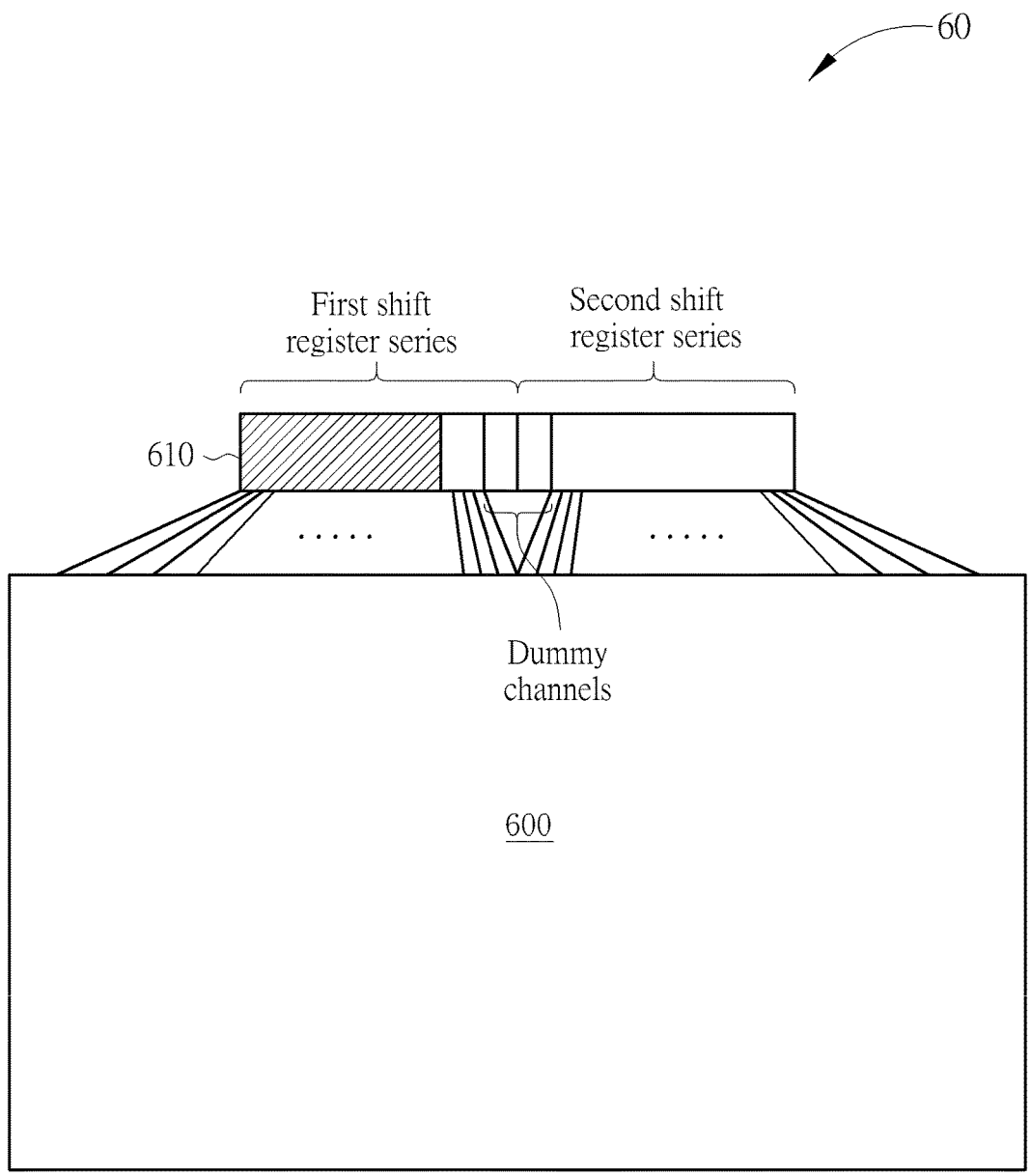
FIGS. 6A-6E are schematic diagrams of the method of transmitting start pulses to the shift registers in a display device according to an embodiment of the present invention.

In FIG. 6A, the first start pulse is transmitted from the timing controller and shifted in the first shift register series, while the second start pulse P2 is not transmitted yet.

Figure 6B:
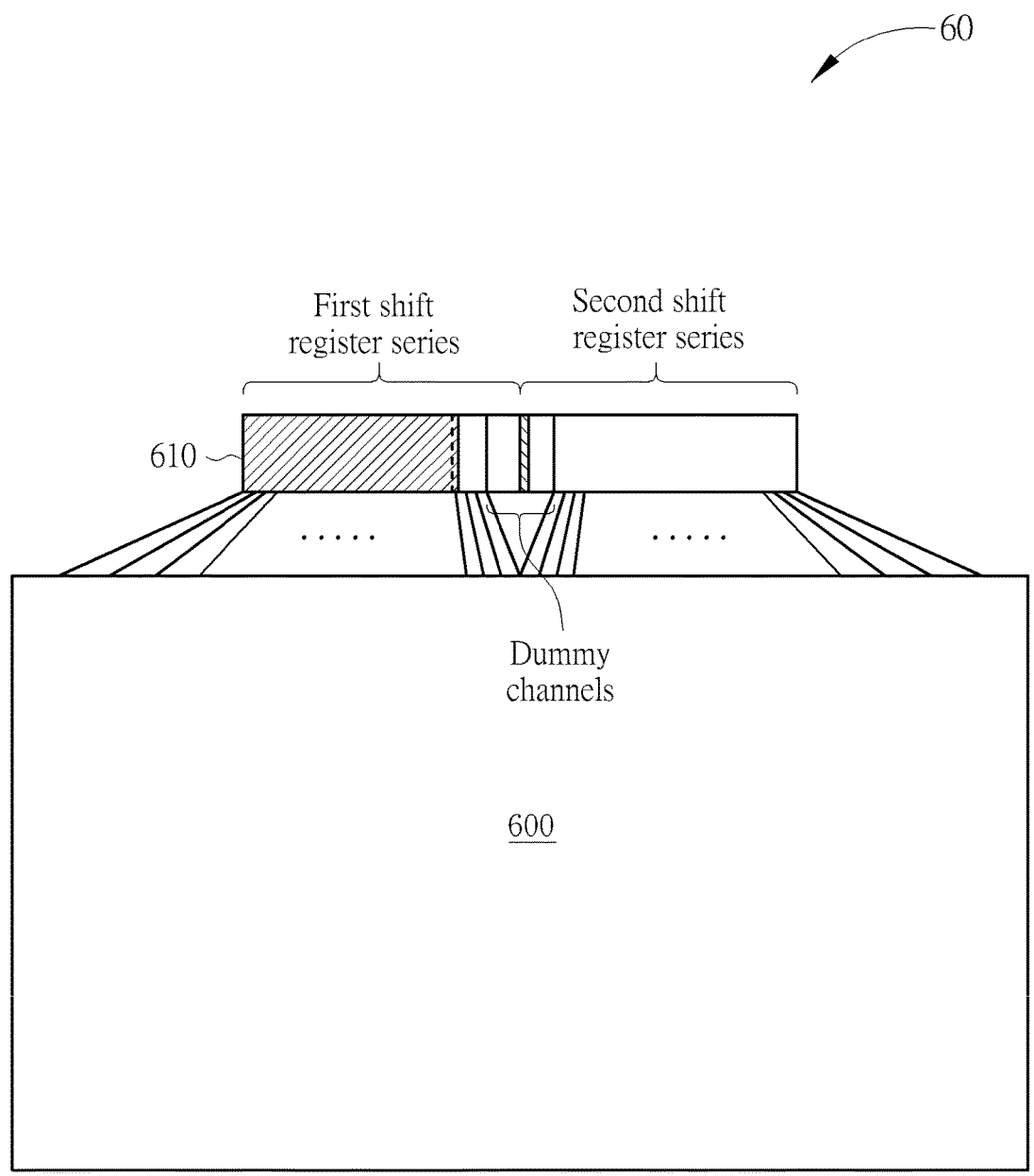

In FIG. 6B, when first start pulse is shifted to the target shift register, substantially at the same time the second start pulse is transmitted by the timing controller to the first shift register of the second shift register series which is corresponding to a dummy channel.

Figure 6C:
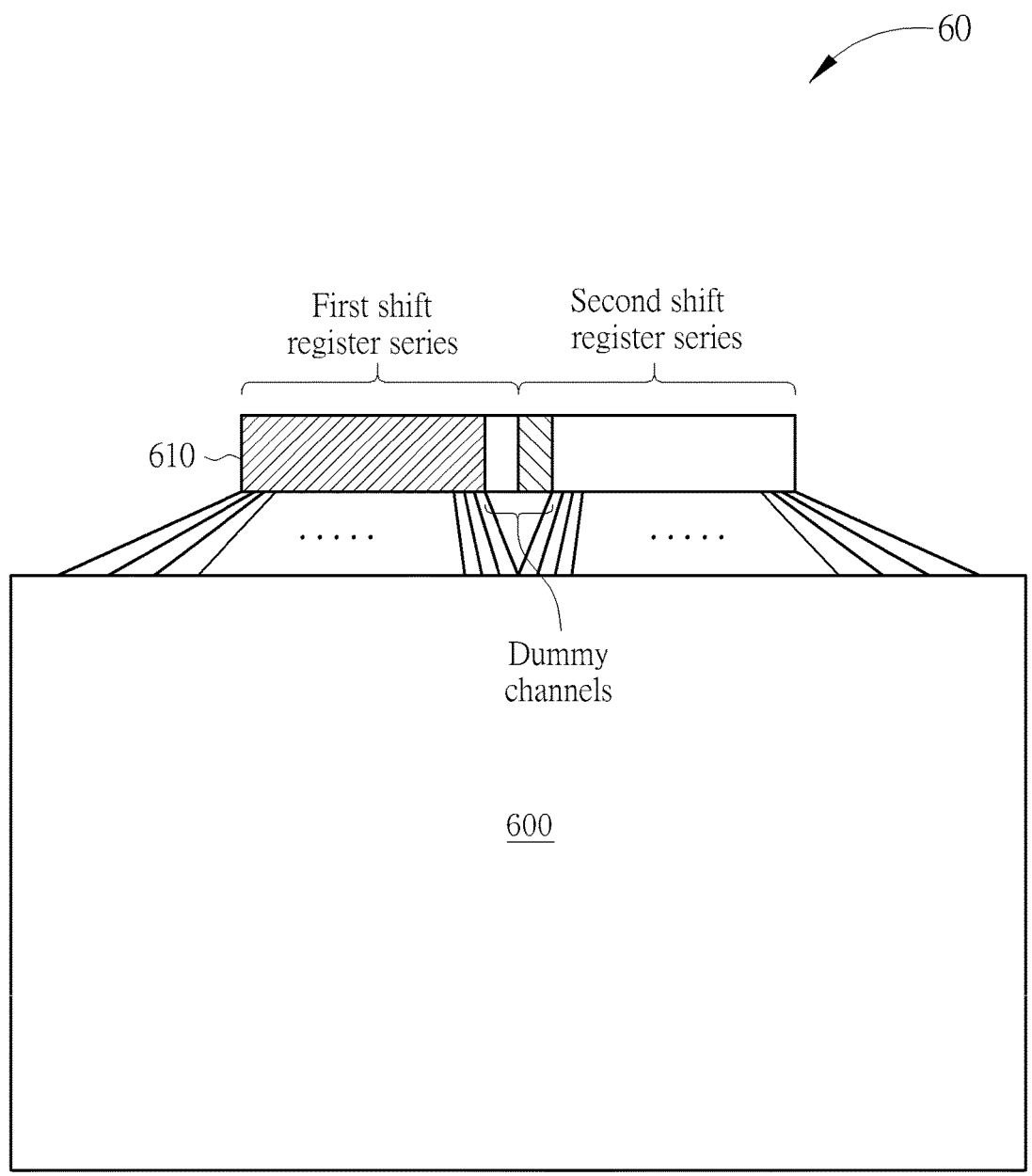

In FIG. 6C, the first start pulse is shifted from a shift register corresponding to a valid output channel to a shift register corresponding to a dummy channel, and correspondingly, the timing controller finishes the display data transmission corresponding to the left part of a horizontal display line. Meanwhile, the second start pulse is shifted from a shift register corresponding to a dummy channel to a shift register corresponding to a valid output channel, and correspondingly, the timing controller may transmit the display data corresponding to the right part of the horizontal display line.

Figure 6D:
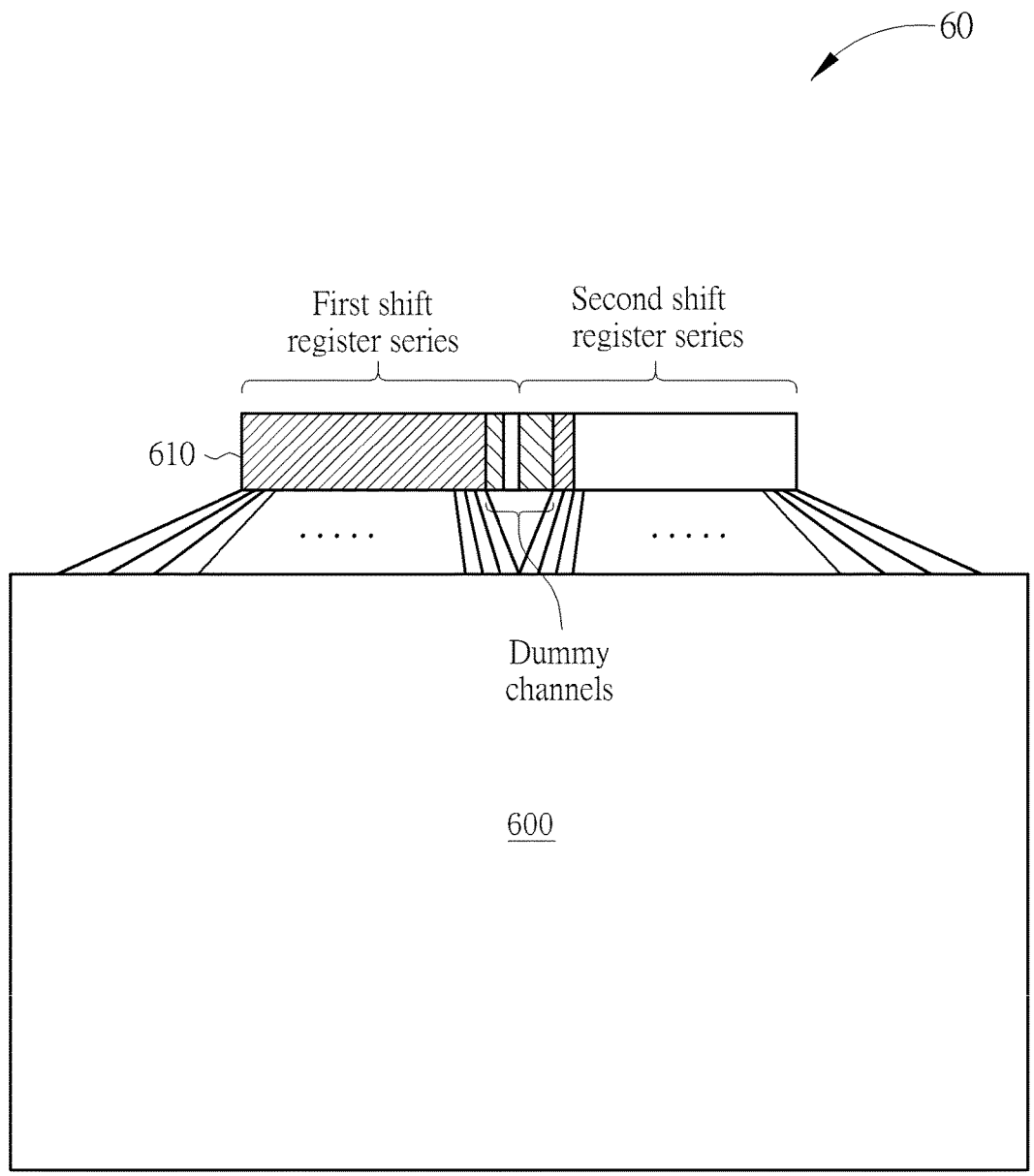

In FIG. 6D, the first start pulse is sequentially shifted through the shift registers corresponding to dummy channels in the first shift register series, and the second start pulse is sequentially shifted through the shift registers corresponding to valid output channels. Therefore, the timing controller may keep transmitting the display data on the data bus. Please note that the first start pulse may keep being shifted in the shift registers corresponding to the dummy channels or stop being shifted in these shift registers without affecting the display operations of the display panel 600. In an embodiment, a shift register may stop shifting the first start pulse when the timing controller stops transmitting the clock signal to the shift register circuit.

Figure 6E:
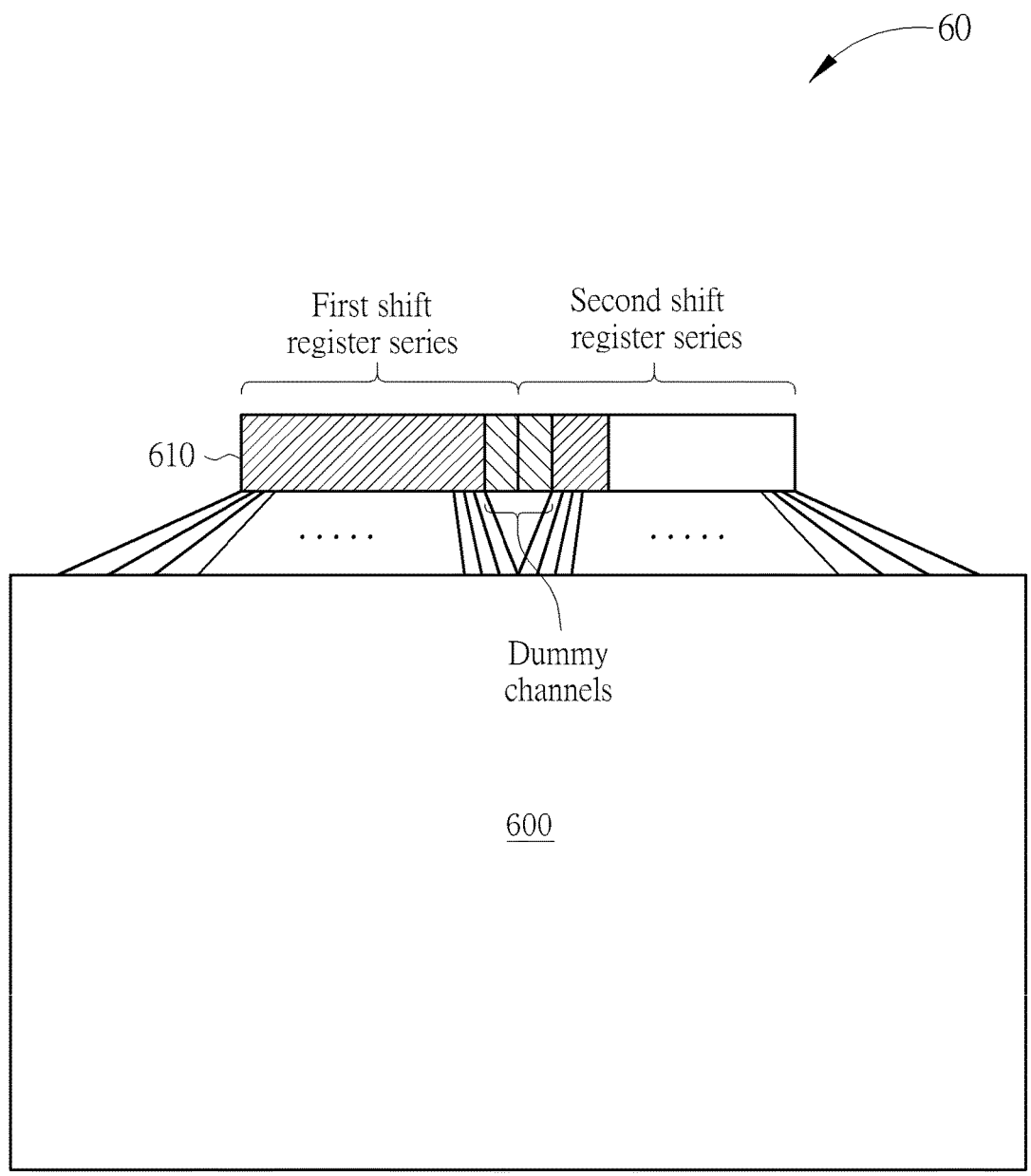

In FIG. 6E, the first start pulse is shifted to the last (as rightmost, in this example) shift register of the first shift register series, and the second start pulse keeps being shifted rightward, and the correspondingly, the timing controller keeps performing the data transmission corresponding to the right part of the horizontal display line. The more detailed implementation of the method shown in FIGS. 6A-6E can be seen in FIG. 3 to FIG. 5E.

Since the timing controller may control the time point of transmitting the first start pulse and the second start pulse, the number of skipped output channels, i.e., the number of dummy channels, may be configured arbitrarily. Therefore, the source driving circuit and the driving system according to embodiments of the present invention are adaptive to any possible horizontal resolution of the display panel without additional connecting wire(s) disposed between nonadjacent shift registers. For a display panel, the horizontal resolution can be finely adjusted or tuned. For example, a source driving circuit having 1280 output channels may support a horizontal resolution of 1280, 1278, 1276, 1274, and so on, by the above method of selecting the time point of transmitting the second start pulse.

Please note that configuration of the number of dummy channels may be determined according to the horizontal resolution of the display panel. In an embodiment, the timing controller includes a counter, and the counter is used for determining when to transmit the second start pulse. The counter may be configured according to the horizontal resolution of the display panel.

In the above embodiment, the shift registers are classified into two shift register series and the timing controller transmits the first start pulse to the first shift register series and transmits the second start pulse to the second shift register series. With this circuit structure of shift registers, an extreme case is that the timing controller transmits the first start pulse and the second start pulse at the same time, an in such a case a half of the output channels in the source driving circuit are configured as dummy channels. Namely, the circuit structure of shift registers allows the driving system to support the horizontal resolution ranging from X/2 to X, where X refers to the total number of output channels in the source driving circuit. In order to be adaptive to the horizontal resolution lower than X/2, the circuit structure of shift registers may further be modified.

Please refer to FIGS. 7A-7C, which are schematic diagrams of a driving system 70 according to an embodiment of the present invention. FIG. 7A illustrates the circuit structure of the driving system 70, which includes a timing controller 712 and a source driving circuit. The source driving circuit includes a plurality of output channels and a plurality of shift registers respectively corresponding to the plurality of output channels. For simplicity, the source driving circuit is configured to include 16 shift registers SR01-SR16 corresponding to 16 output channels. Other components and circuit elements of the source driving circuit, such as the latch circuit, the level shifter circuit, the DAC circuit and the output buffer circuit, are omitted herein without influencing the illustrations of the present embodiment. FIG. 7B illustrates a circuit configuration when the driving system 70 of FIG. 7A is utilized for driving a display panel having a horizontal resolution which is same as a half of the resolution, or less than a half of the resolution, that the source driving circuit of the driving system 70 of FIG. 7A can support. FIG. 7C illustrates another circuit configuration when the driving system 70 of FIG. 7A is utilized for driving a display panel having a horizontal resolution (equivalent or) greater than a half of the resolution that the source driving circuit of the driving system 70 of FIG. 7A can support.

Similar to the source driving circuit shown in FIG. 3, the shift registers SR01-SR16 in the source driving circuit of the driving system 70 shown in FIG. 7A are also classified into 2 shift register series, where the first shift register series includes 8 shift registers SR01-SR08 and are disposed at one side of the timing controller 712, and the second shift register series includes 8 shift registers SR09-SR16 and are disposed at the other side of the timing controller 712. In addition, in FIG. 7A, the source driving circuit further includes 4 switches SW1-SW4 coupled between the shift registers SR01-SR16. In detail, the switch SW1 is coupled between the timing controller 712 and the shift register SR08, the switch SW2 is coupled between two adjacent shift registers SR04 and SR05 and also coupled to the timing controller 712, the switch SW3 is coupled between the timing controller 712 and the shift register SR09, and the switch SW4 is coupled between two adjacent shift registers SR12 and SR13 and also coupled to the timing controller 712. Each of the switches SW1-SW4 may receive a control signal which controls the operations of the switches SW1-SW4, and the control signal is omitted in FIGS. 7A-7C for simplicity.

The switches SW1-SW4 may be configured such that the source driving circuit of the driving system 70 may be applicable to a display panel having a horizontal resolution which is same as a half of the resolution, or less than a half of the resolution, that the source driving circuit can support, i.e., same as or less than a half of the number of output channels in the source driving circuit. In an embodiment as shown in FIG. 7B, the switch SW1 is turned off and the switch SW2 is turned on to connect the timing controller 712 to the shift register SR04; hence, the shift registers SR05-SR08 may be disabled and the output channels corresponding to the shift registers SR05-SR08 are configured as dummy channels. Similarly, the switch SW3 is turned off and the switch SW4 is turned on to connect the timing controller 712 to the shift register SR13; hence, the shift registers SR09-SR12 may be disabled and the output channels corresponding to the shift registers SR09-SR12 are configured as dummy channels. In such a situation, the timing controller 712 may transmit the first start pulse to the shift register SR01 and transmit the second start pulse to the shift register SR13. The timing controller 712 may determine the time point of transmitting the second start pulse and more dummy channels may be configured correspondingly.

Figure 8A:
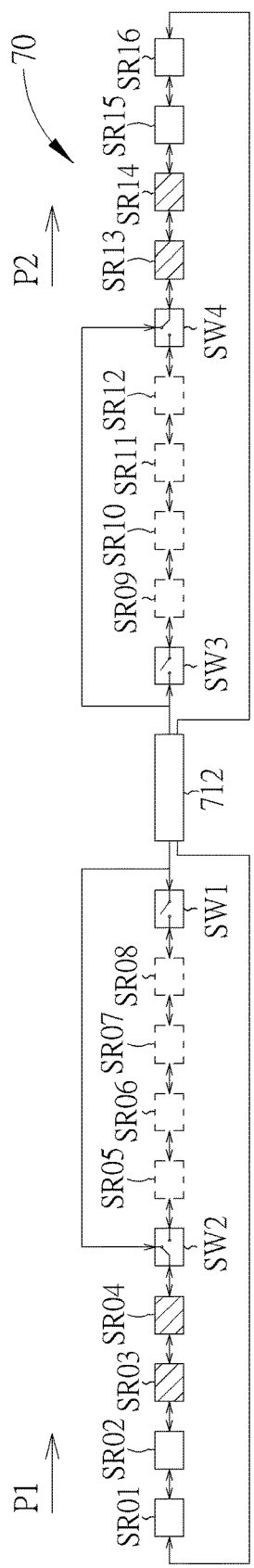
FIG. 8A is a schematic diagram of the driving system shown in FIG. 7A applied to a display device having a horizontal resolution of 4.

In the example of FIG. 7B, an extreme case is that a half of the output channels corresponding to the enabled shift registers SR01-SR04 and SR13-SR16 are configured as dummy channels, illustrated in FIG. 8A. FIG. 8A illustrates a scenario where the driving system 70 is applied to a display device having a horizontal resolution of 4; hence, there are 12 dummy channels in the source driving circuit. In this embodiment, the output channels corresponding to the shift registers SR03-SR14 are configured as dummy channels. The switch SW1 is turned off and the switch SW2 is turned on to connect the timing controller 712 to the shift register SR04, and the switch SW3 is turned off and the switch SW4 is turned on to connect the timing controller 612 to the shift register SR13. In such a case, the timing controller transmits the first start pulse and the second start pulse at the same time.

Figure 8B:
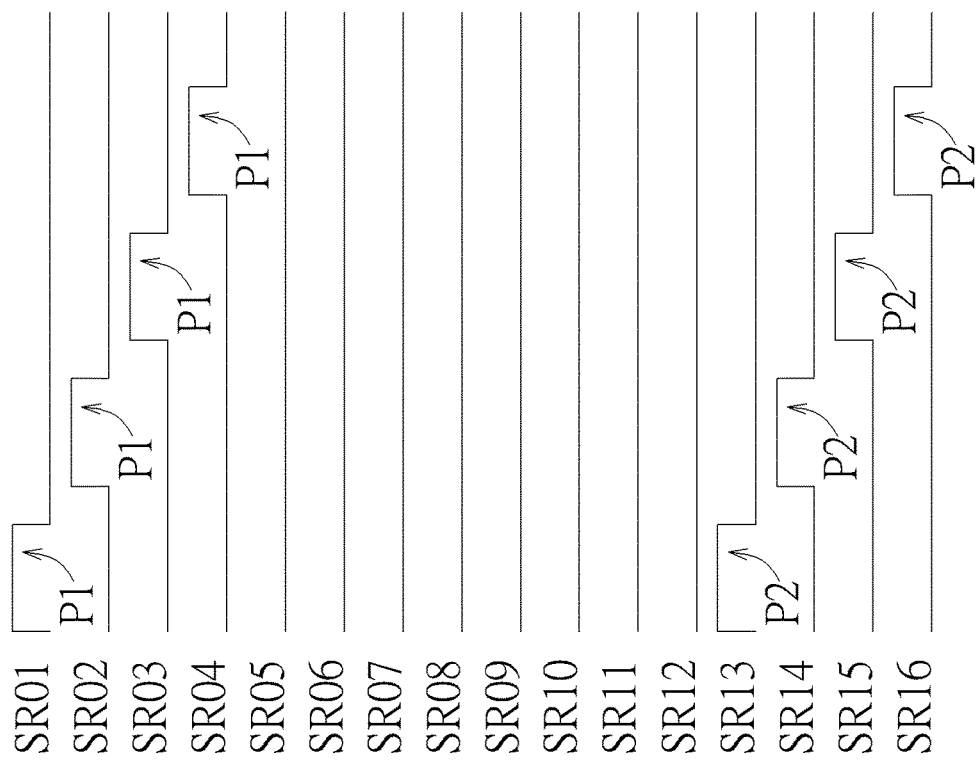
FIG. 8B is a waveform diagram illustrating the waveforms of the start pulses in the source driving circuit shown in FIG. 8A.

FIG. 8B is a waveform diagram illustrating the waveforms of the start pulses in the source driving circuit shown in FIG. 8A. As shown in FIG. 8B, the second start pulse P2 is transmitted to the shift register SR13 when the first start pulse P1 is transmitted to the shift register SR01; that is, the timing controller 712 transmits the first start pulse P1 and the second start pulse P2 at the same time. In this example, the target shift register may be the shift register SR01. When the first start pulse P1 is shifted to the shift register SR03 corresponding to a dummy channel, the second start pulse P2 is shifted to the shift register SR15 corresponding to a valid output channel.

Alternatively, if the driving system 70 is used for a display panel having a horizontal resolution greater than or equal to 8, the switches SW1-SW4 may be configured in a manner shown in FIG. 7C. In detail, the switch SW1 is turned on to connect the timing controller 712 to the shift register SR08, and the switch SW2 is turned on to connect the shift registers SR04 and SR05. At the right hand side, the switch SW3 is turned on to connect the timing controller 712 to the shift register SR09, and the switch SW4 is turned on to connect the shift registers SR12 and SR13. In this embodiment shown in FIG. 7C, the operations of the driving system 70 are similar to those shown in FIGS. 4A-4D and 5A-5D, and are not narrated herein.

Please note that the present invention aims at providing a novel circuit structure of shift registers in the source driving circuit and a method of driving a display panel by controlling the time point of transmitting the start pulses by the timing controller, allowing the source driving circuit to be adaptive to more horizontal resolutions of the display panels. Those skilled in the art may make modifications and alternations accordingly. For example, in the above embodiments, the number of shift registers in each shift register series is equivalent; however, in another embodiment, the number of shift registers in the first shift register series may be greater or less than the number of shift registers in the second shift register series. Also, in the above embodiments, the output channels in the middle are configured as the dummy channels and the dummy channels are evenly disposed at the left-hand side and right-hand side of the timing controller. In another embodiment, the leftmost and/or rightmost output channels may be configured as the dummy channels and the middle output channels may be coupled to data lines of the display panel. In a further embodiment, all or most dummy channels are configured at the same side of the timing controller. Note that it is preferable to configure the dummy channels in the middle and evenly disposed at the left-hand side and right-hand side of the timing controller, since this disposition may lead to symmetric loading of the display device.

Please also note that the timing controller may be or may not be disposed at the middle of the shift registers. In an embodiment, the timing controller and the source driving circuit may be included in a single semiconductor chip. In other words, a display driver IC may include the timing controller and the source driving circuit, and this display driver IC is preferably used for a small-scale display device. In another embodiment, the timing controller may be included in a semiconductor chip, and the source driving circuit may be included in another semiconductor chip, or formed by multiple semiconductor chips. In a driving system of a large-scale display device may include one or more source driver ICs and one timing controller IC.

In an embodiment, the shift registers may be classified into more series. For example, a source driving circuit may include 4 shift register series, and the timing controller is connected to both ends of each of the four shift register series. This implementation may be realized when the source driving circuit has two source driver ICs, and the shift registers in each source driver IC are separated to two groups. In this embodiment, the timing controller may also configure the time point of transmitting a respective start pulse to a respective shift register series, allowing the source driving circuit to be adaptive to display devices of different horizontal resolutions. For example, a first start pulse may be transmitted to a first shift register series, a second start pulse may be transmitted to a second shift register series, a third start pulse may be transmitted to a third shift register series, and a fourth start pulse may be transmitted to a fourth shift register series. The shift registers corresponding to dummy channels may be evenly configured in the four shift register series. Therefore, the timing controller may transmit the second start pulse before the first start pulse is shifted to a target shift register, and transmit the fourth start pulse before the third start pulse is shifted to another target shift register.

Figure 9:
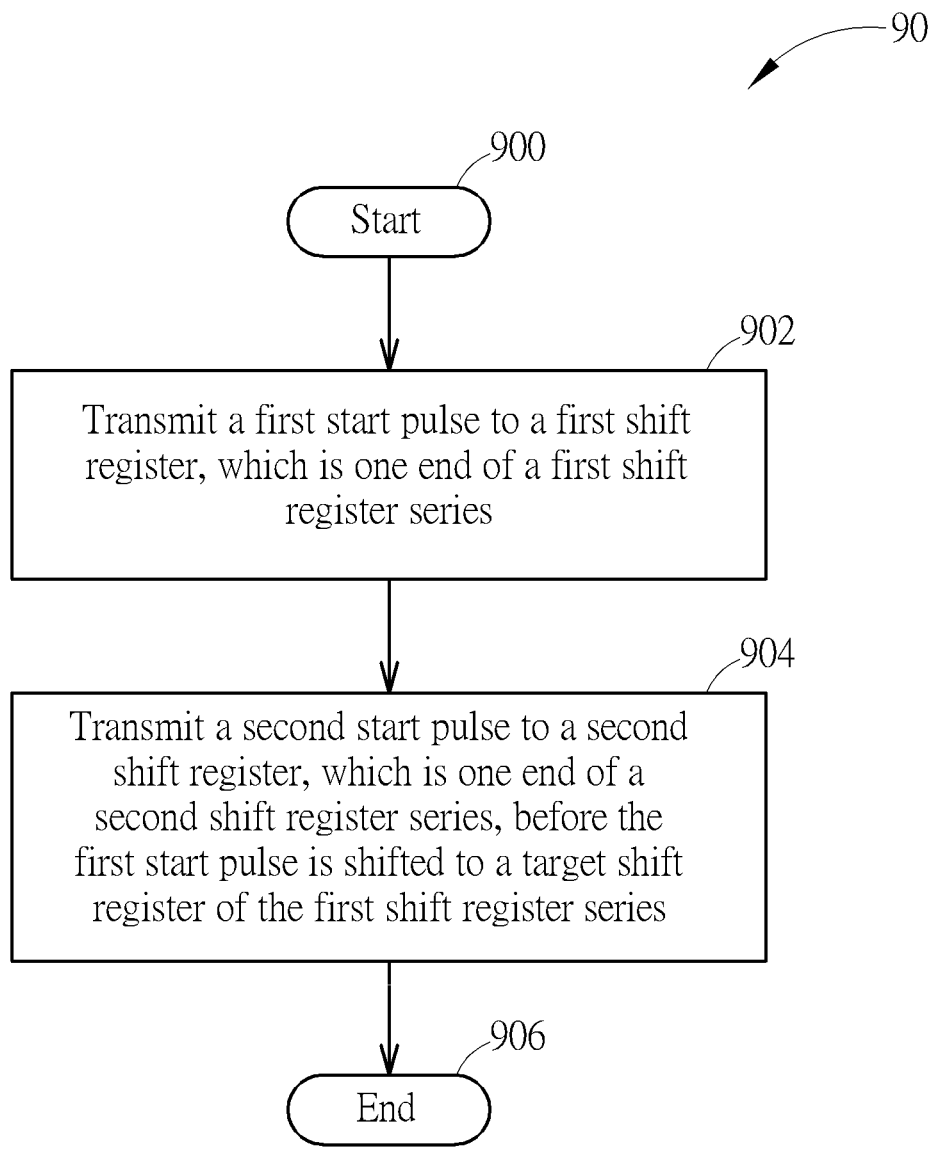
FIG. 9 is a schematic diagram of a process according to an embodiment of the present invention.

The above operations of transmitting the start pulses to the shift registers may be summarized into a process 90, as shown in FIG. 9. The process 90, which may be used in a timing controller of a display device, includes the following steps:

Step 900: Start.
Step 902: Transmit a first start pulse to a first shift register, which is one end of a first shift register series.
Step 904: Transmit a second start pulse to a second shift register, which is one end of a second shift register series, before the first start pulse is shifted to a target shift register of the first shift register series.
Step 906: End.

The detailed operations of the process 90 are described in the above paragraphs, and will not be narrated hereinafter.

To sum up, the embodiments of the present invention provides a novel circuit structure of shift registers in the source driving circuit and a method of driving a display panel by controlling the time point of transmitting the start pulse by the timing controller. The shift registers are classified into a plurality of shift register series, and the timing controller is connected to both ends of each of the shift register series. The timing controller first transmits a first start pulse to the first shift register series. The timing controller transmits a second start pulse before the first start pulse is shifted to a target shift register. With control of the time point of transmitting the second start pulse, the source driving circuit is adaptive to display panels having different horizontal resolutions.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A driving system for driving a display panel, comprising:
   a timing controller, configured to generate a first start pulse and a second start pulse; and
   a source driving circuit, comprising a plurality of output channels and a plurality of shift registers respectively corresponding to the plurality of output channels;
   wherein the plurality of shift registers are classified into a plurality of shift register series, a first shift register series among the plurality of shift register series comprises a first shift register being as one end of the first shift register series and a second shift register being as the other end of the first shift register series, and a second shift register series among the plurality of shift register series comprises a third shift register being as one end of the second shift register series and a fourth shift register being as the other end of the second shift register series;
   wherein the timing controller is connected to the first shift register, the second shift register, the third shift register, and the fourth shift register without being through another shift register, and the timing controller is configured to transmit the first start pulse to the first shift register and to transmit the second start pulse to the third shift register, wherein the first start pulse starts to be transmitted before the second start pulse starts to be transmitted.

2. The driving system of claim 1, wherein a first portion of the first shift register series, including the second shift register, and a second portion of the second shift register series, including the third shift register, are corresponding to a plurality of dummy channels which are included in the plurality of output channels and not coupled to data lines of the display panel.

3. The driving system of claim 1, wherein the second start pulse is transmitted to the third shift register when the first start pulse is shifted to a target shift register of the first shift register series.

4. The driving system of claim 3, wherein the first shift register and the target shift register are separated by N-D-1 shift registers, wherein N equals the number of shift registers of the first shift register series, and D equals the number of dummy channels which are included in the plurality of output channels and not coupled to data lines of the display panel.

5. The driving system of claim 1, wherein the timing controller receives an indication indicating the horizontal resolution of the display panel, and determines to transmit the second start pulse at a time point according to the indication, wherein the time point allows the second start pulse to be shifted to the third shift register when the first start pulse is shifted to a target shift register of the first shift register series.

6. The driving system of claim 5, wherein the timing controller comprises a counter, for determining when to transmit the second start pulse to the third shift register, wherein the counter is configured according to the horizontal resolution of the display panel.

7. The driving system of claim 1, further comprising:
a first switch, coupled between the timing controller and the second shift register;
a second switch, coupled between two adjacent shift registers among the first shift register series and coupled to the timing controller;
a third switch, coupled between the timing controller and the third shift register; and
a fourth switch, coupled between two adjacent shift registers among the second shift register series and coupled to the timing controller.

8. The driving system of claim 7, wherein the first switch is turned off and the second switch is turned on to connect the timing controller to one of the two adjacent shift registers which is relatively closer to the first shift register when the horizontal resolution of the display panel is less than a half of the number of output channels in the driving system.

9. The driving system of claim 1, wherein the second shift register of the first shift register series and the third shift register of the second shift register series are not connected.

10. The driving system of claim 1, wherein the timing controller and the source driving circuit are comprised in a semiconductor chip.

11. The driving system of claim 1, wherein the source driving circuit is formed by a plurality of first semiconductor chips, and the timing controller is a second semiconductor chip.

12. A display device, comprising:
a display panel;
a timing controller, configured to generate a first start pulse and a second start pulse; and
a source driving circuit, for driving the display panel, comprising a plurality of output channels and a plurality of shift registers respectively corresponding to the plurality of output channels;
wherein the plurality of shift registers are classified into a plurality of shift register series, a first shift register series among the plurality of shift register series comprises a first shift register being as one end of the first shift register series and a second shift register being as the other end of the first shift register series, and a second shift register series among the plurality of shift register series comprises a third shift register being as one end of the second shift register series and a fourth shift register being as the other end of the second shift register series;
wherein the timing controller is connected to the first shift register, the second shift register, the third shift register, and the fourth shift register without being through another shift register, and the timing controller is configured to transmit the first start pulse to the first shift register and to transmit the second start pulse to the third shift register, wherein the first start pulse starts to be transmitted before the second start pulse starts to be transmitted.

13. The display device of claim 12, wherein a first portion of the first shift register series, including the second shift register, and a second portion of the second shift register series, including the third shift register, are corresponding to a plurality of dummy channels which are included in the plurality of output channels and not coupled to data lines of the display panel.

14. The display device of claim 12, wherein the second start pulse is shifted to the third shift register when the first start pulse is shifted to a target shift register of the first shift register series.

15. The display device of claim 14, wherein the first shift register and the target shift register are separated by N-D-1 shift registers, wherein N equals the number of shift registers of the first shift register series, and D equals the number of dummy channels which are included in the plurality of output channels and not coupled to data lines of the display panel.

16. The display device of claim 12, wherein the timing controller receives an indication indicating the horizontal resolution of the display panel, and determines to transmit the second start pulse at a time point according to the indication, wherein the time point allows the second start pulse to be shifted to the third shift register when the first start pulse is shifted to a target shift register of the first shift register series.

17. The display device of claim 16, wherein the timing controller comprises a counter, for determining when to transmit the second start pulse to the third shift register, wherein the counter is configured according to the horizontal resolution of the display panel.

18. The display device of claim 12, wherein the source driving circuit further comprises:
a first switch, coupled between the timing controller and the second shift register;
a second switch, coupled between two adjacent shift registers among the first shift register series and coupled to the timing controller;
a third switch, coupled between the timing controller and the third shift register; and
a fourth switch, coupled between two adjacent shift registers among the second shift register series and coupled to the timing controller.

19. The display device of claim 18, wherein the first switch is turned off and the second switch is turned on to connect the timing controller to one of the two adjacent shift registers which is relatively closer to the first shift register when the horizontal resolution of the display panel is less than a half of the number of output channels in the driving system.

20. The display device of claim 12, wherein the second shift register of the first shift register series and the third shift register of the second shift register series are not connected.

21. The display device of claim 12, wherein the timing controller and the source driving circuit are comprised in a semiconductor chip.

22. The display device of claim 12, wherein the source driving circuit is formed by a plurality of first semiconductor chips, and the timing controller is a second semiconductor chip.

23. A method of driving a display panel for a driving system comprising a timing controller and a source driving circuit, the method comprising:
transmitting, by the timing controller, a first start pulse to one end of a first shift register series of the source driving circuit; and
transmitting, by the timing controller, a second start pulse to one end of a second shift register series of the source driving circuit, before the first start pulse is shifted to a target shift register of the first shift register series;

wherein the first start pulse starts to be transmitted before the second start pulse starts to be transmitted.

24. The method of claim 23, wherein a first portion of the first shift register series and a second portion of the second shift register series are corresponding to a plurality of dummy channels which are included in a plurality of output channels of the source driving circuit and not coupled to data lines of the display panel.

25. The method of claim 23, wherein the second start pulse is transmitted to a third shift register when the first start pulse is shifted to the target shift register of the first shift register series.

26. The method of claim 25, wherein the first shift register and the target shift register are separated by N-D-1 shift registers, wherein N equals the number of shift registers of the first shift register series, and D equals the number of dummy channels which are included in a plurality of output channels of the source driving circuit and not coupled to data lines of the display panel.

27. The method of claim 23, further comprising:

determining, by the timing controller, when to transmit the second start pulse to a third shift register, according to the horizontal resolution of the display panel.

* * * * *